(12) United States Patent
Tanaka

(10) Patent No.: US 12,089,470 B2
(45) Date of Patent: Sep. 10, 2024

(54) DISPLAY DEVICE

(71) Applicant: SHARP KABUSHIKI KAISHA, Sakai (JP)

(72) Inventor: Yuji Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/031,591

(22) PCT Filed: Oct. 14, 2020

(86) PCT No.: PCT/JP2020/038708
§ 371 (c)(1),
(2) Date: Apr. 12, 2023

(87) PCT Pub. No.: WO2022/079819
PCT Pub. Date: Apr. 21, 2022

(65) Prior Publication Data
US 2023/0263030 A1    Aug. 17, 2023

(51) Int. Cl.
*G09G 3/20*     (2006.01)
*H10K 50/115*   (2023.01)
*H10K 59/38*    (2023.01)
*H10K 59/12*    (2023.01)

(52) U.S. Cl.
CPC .......... *H10K 59/38* (2023.02); *G09G 3/2007* (2013.01); *H10K 50/115* (2023.02); *G09G 2300/0819* (2013.01); *G09G 2300/0842* (2013.01); *G09G 2300/0861* (2013.01); *G09G 2320/0626* (2013.01); *G09G 2360/16* (2013.01); *H10K 59/12* (2023.02)

(58) Field of Classification Search
CPC ...... H10K 59/38; H10K 50/115; H10K 59/12; G09G 3/2007; G09G 2300/0819; G09G 2300/0842; G09G 2300/0861; G09G 2320/0626; G09G 2360/16
See application file for complete search history.

(56) References Cited

U.S. PATENT DOCUMENTS

| | | | |
|---|---|---|---|
| 2011/0089809 A1 | 4/2011 | Noh | |
| 2015/0333102 A1 | 11/2015 | Sato | |
| 2018/0059485 A1* | 3/2018 | Nam | .......... G02F 1/133602 |
| 2020/0119297 A1* | 4/2020 | Lee | .......... H10K 50/15 |

FOREIGN PATENT DOCUMENTS

| | | | |
|---|---|---|---|
| JP | 2015220069 A | 12/2015 | |
| JP | 2020061369 A | 4/2020 | |
| KR | 20110041824 A | 4/2011 | |

* cited by examiner

*Primary Examiner* — Robert J Michaud
(74) *Attorney, Agent, or Firm* — ScienBiziP, P.C.

(57) ABSTRACT

A display device includes a light-emitting element layer including a first electrode and a second electrode, and a first quantum dot light-emitting layer disposed between the first electrode and the second electrode, and a light source element configured to irradiate the light-emitting element layer with ultraviolet light.

18 Claims, 20 Drawing Sheets

(a)

(b)

DISPLAY DEVICE

TECHNICAL FIELD

The disclosure relates to a display device.

BACKGROUND ART

PTL 1 discloses a method of increasing the luminous efficiency of quantum dots by removing some of ligands bonded to shells in a display device including a light-emitting layer including the quantum dots having core-shell structures.
PTL 1: JP 2020-61369 A

CITATION LIST

Patent Literature

SUMMARY OF INVENTION

Technical Problem in this known method, a process of forming the light-emitting layer is not easily performed, and thus, another method for improving the luminous efficiency is required.

Solution to Problem

A display device according to an aspect of the disclosure includes a light-emitting element layer including a first electrode and a second electrode, and a first quantum dot light-emitting layer disposed between the first electrode and the second electrode, and a light source element configured to irradiate the light-emitting element layer with ultraviolet light.

ADVANTAGEOUS EFFECTS OF DISCLOSURE

According to the aspect of the disclosure, by irradiating the light-emitting element layer with the ultraviolet light from the light source element, it is possible to enhance the luminous efficiency of the light-emitting element layer.

FIG. 1 is a block diagram illustrating a configuration of a display device according to the present embodiment.

FIGS. 2(a) to (c) are cross-sectional views illustrating configuration examples of the display device according to the present embodiment.

FIGS. 3(a) to (c) are cross-sectional views illustrating configuration examples of the display device according to the present embodiment.

FIGS. 4(a) to (c) are cross-sectional views illustrating configuration examples of the display device according to the present embodiment.

FIGS. 5(a) to (c) are cross-sectional views illustrating configuration examples of the display device according to the present embodiment.

FIGS. 6(a) and (b) are cross-sectional views illustrating configuration examples of the display device according to the present embodiment.

FIGS. 7(a) and (b) are cross-sectional views illustrating configuration examples of the display device according to the present embodiment.

Figure 11:
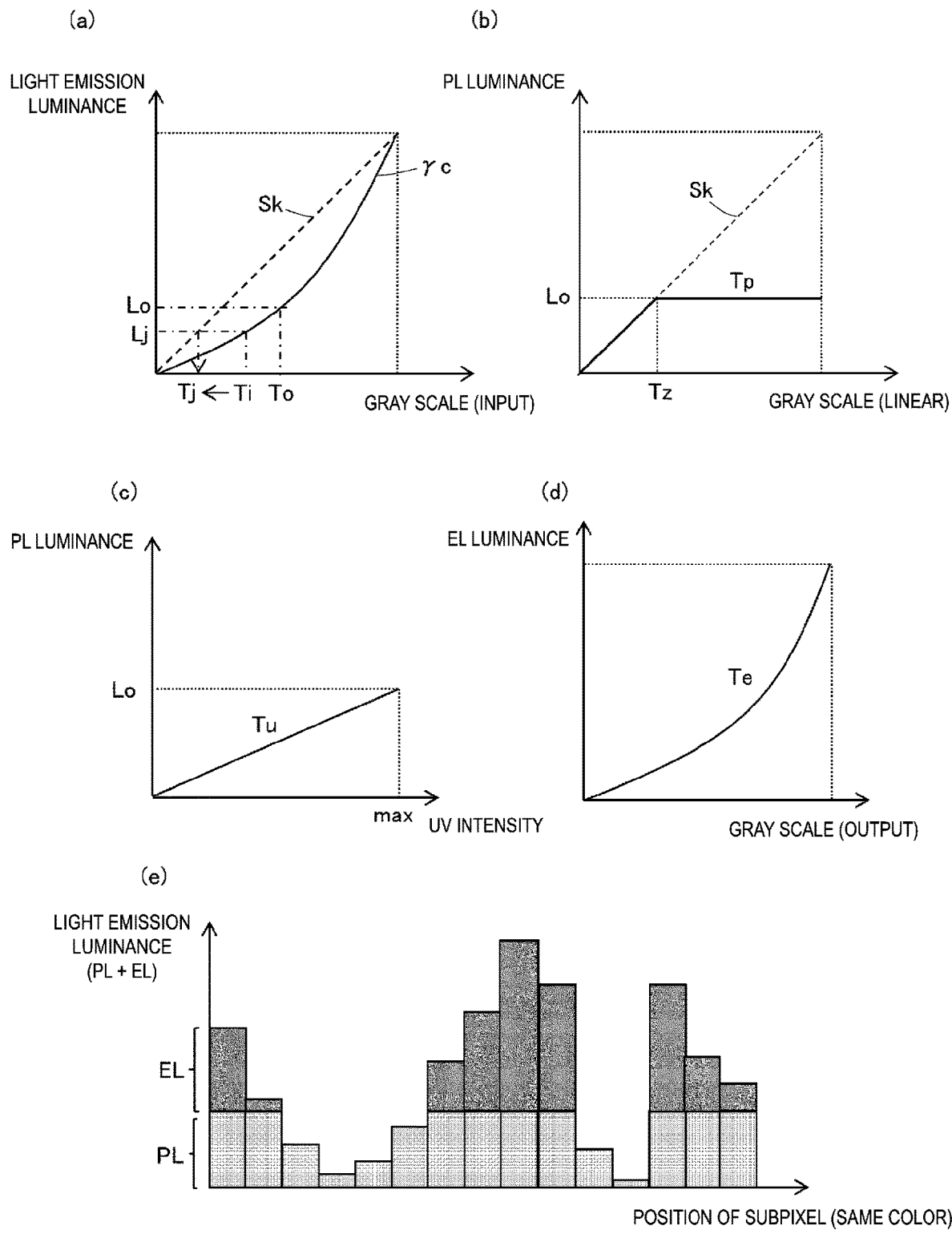

FIG. 11(a) is a graph showing a gray scale-light emission luminance characteristic of a subpixel, FIG. 11(b) is a graph showing a relationship between a linear gray scale and a PL luminance, FIG. 11(c) is a graph showing a relationship between a UV intensity and a PL luminance, FIG. 11(d) is a graph showing a relationship between a gray scale and an EL luminance, and FIG. 11(e) is an explanatory diagram showing an example of a position of a subpixel and a light emission intensity.

Figure 12:
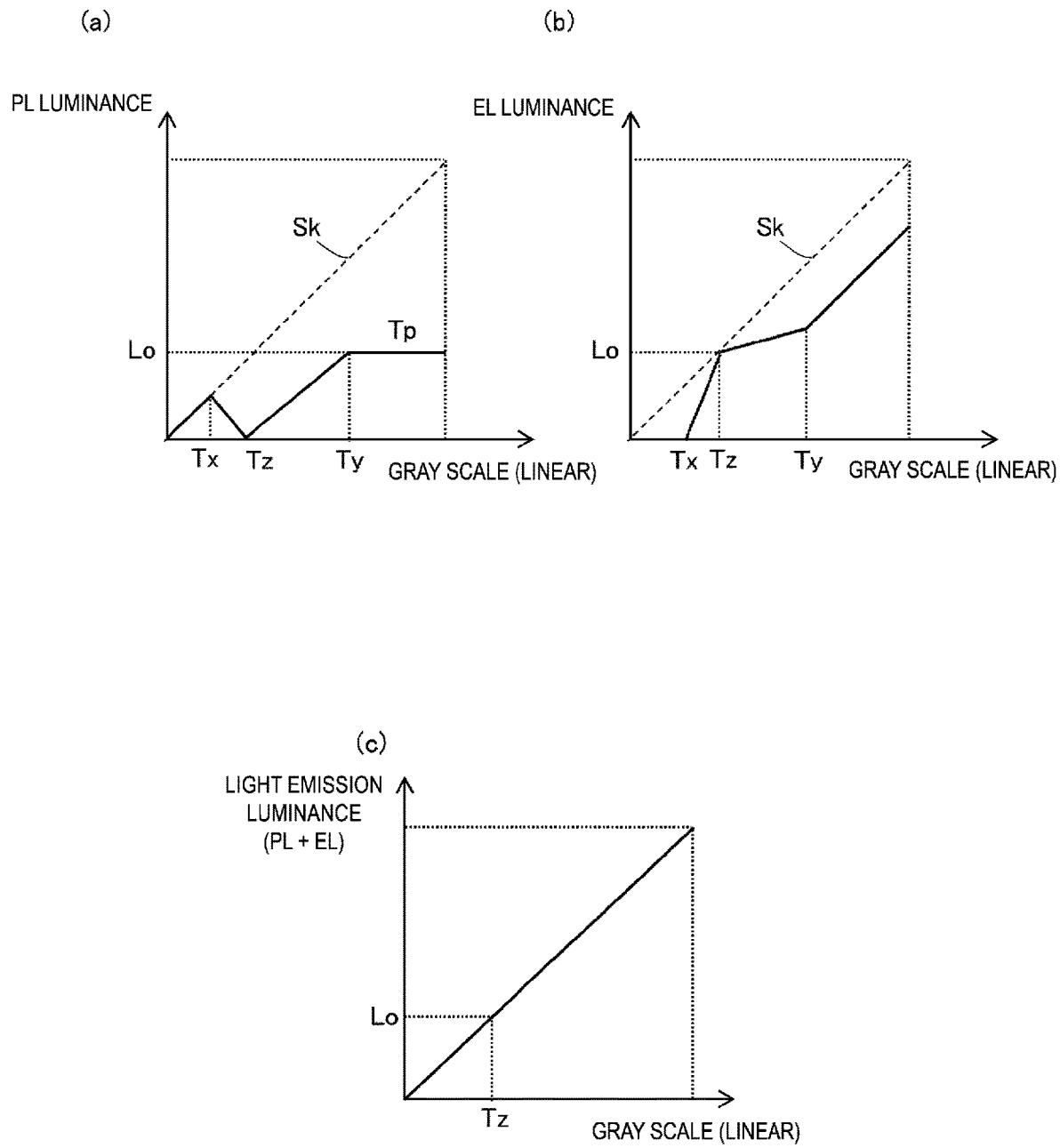

FIG. 12(a) shows a modified example of a PL luminance table, FIG. 12(b) shows an EL luminance characteristic when the PL luminance table shown in FIG. 12(a) is used, and FIG. 12(c) shows a light emission luminance (PL luminance+EL luminance) characteristic when the PL luminance table shown in FIG. 12(a) is used.

Figure 13:
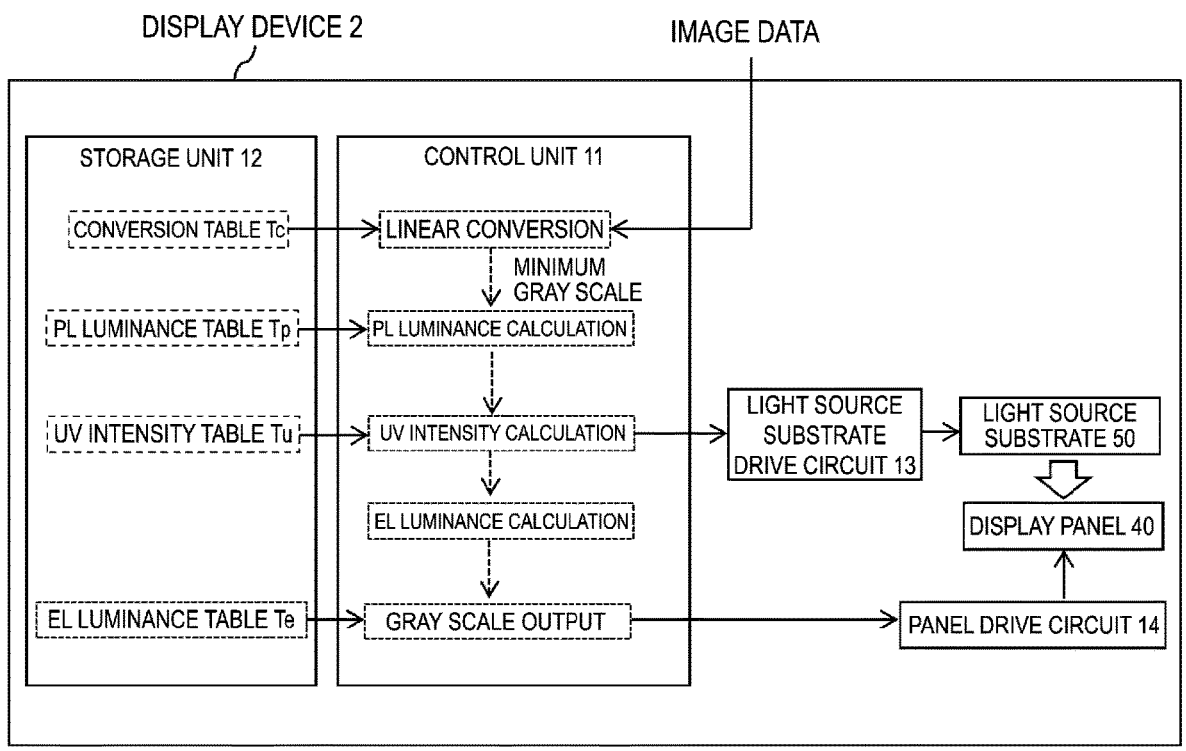

FIG. 13 is a block diagram illustrating the functions of units of a display device according to a second embodiment.

Figure 14:
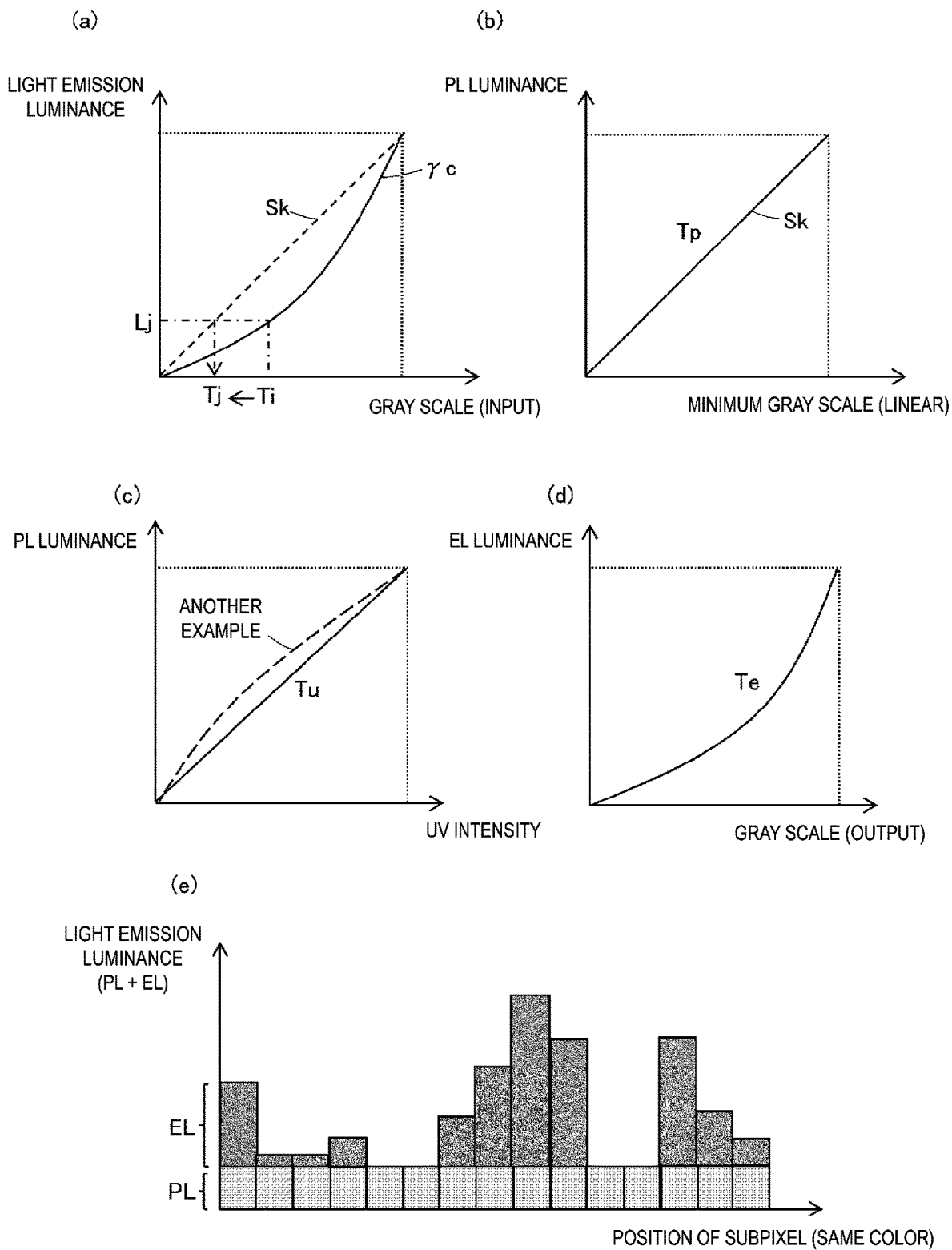

FIG. 14(a) is a graph showing a gray scale-light emission luminance characteristic of a subpixel, FIG. 14(b) is a graph showing a relationship between a minimum linear gray scale and a PL luminance, FIG. 14(c) is a graph showing a relationship between a UV intensity and a PL luminance, FIG. 14(d) is a graph showing a relationship between a gray scale and an EL luminance, and FIG. 14(e) is an explanatory diagram showing an example of a position of a subpixel and a light emission intensity.

Figure 15:
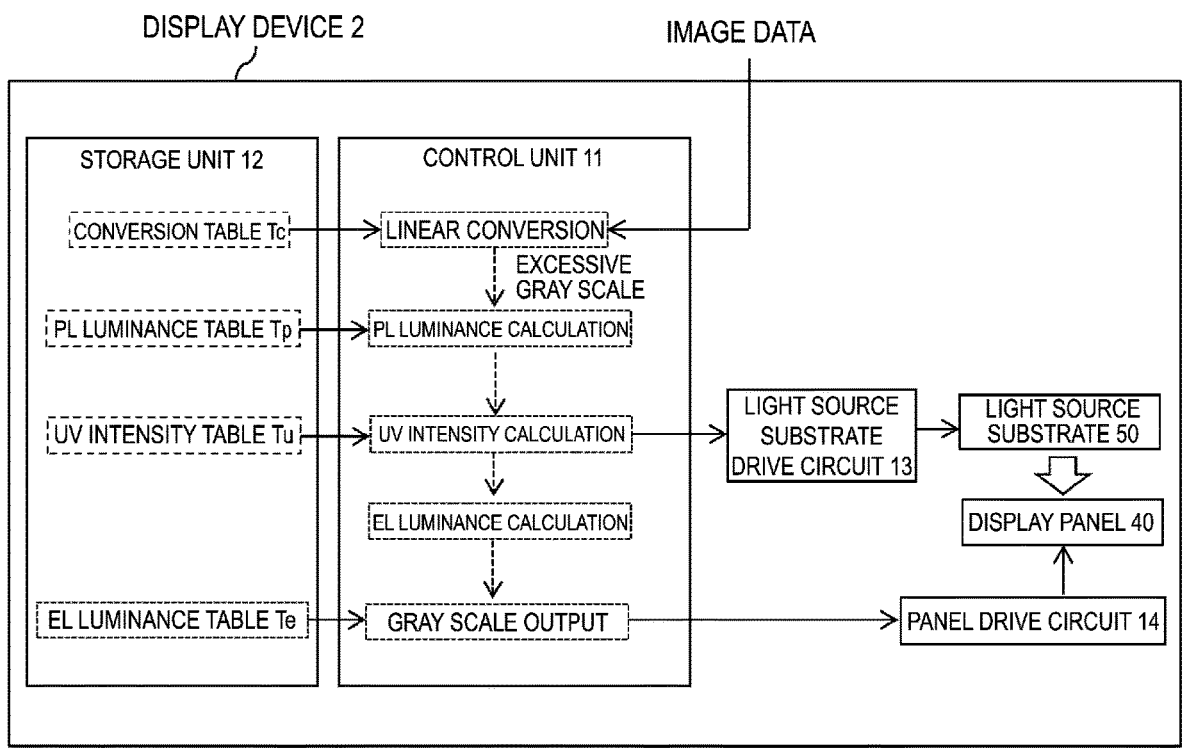

FIG. 15 is a block diagram illustrating the functions of units of a display device according to a third embodiment.

Figure 16:
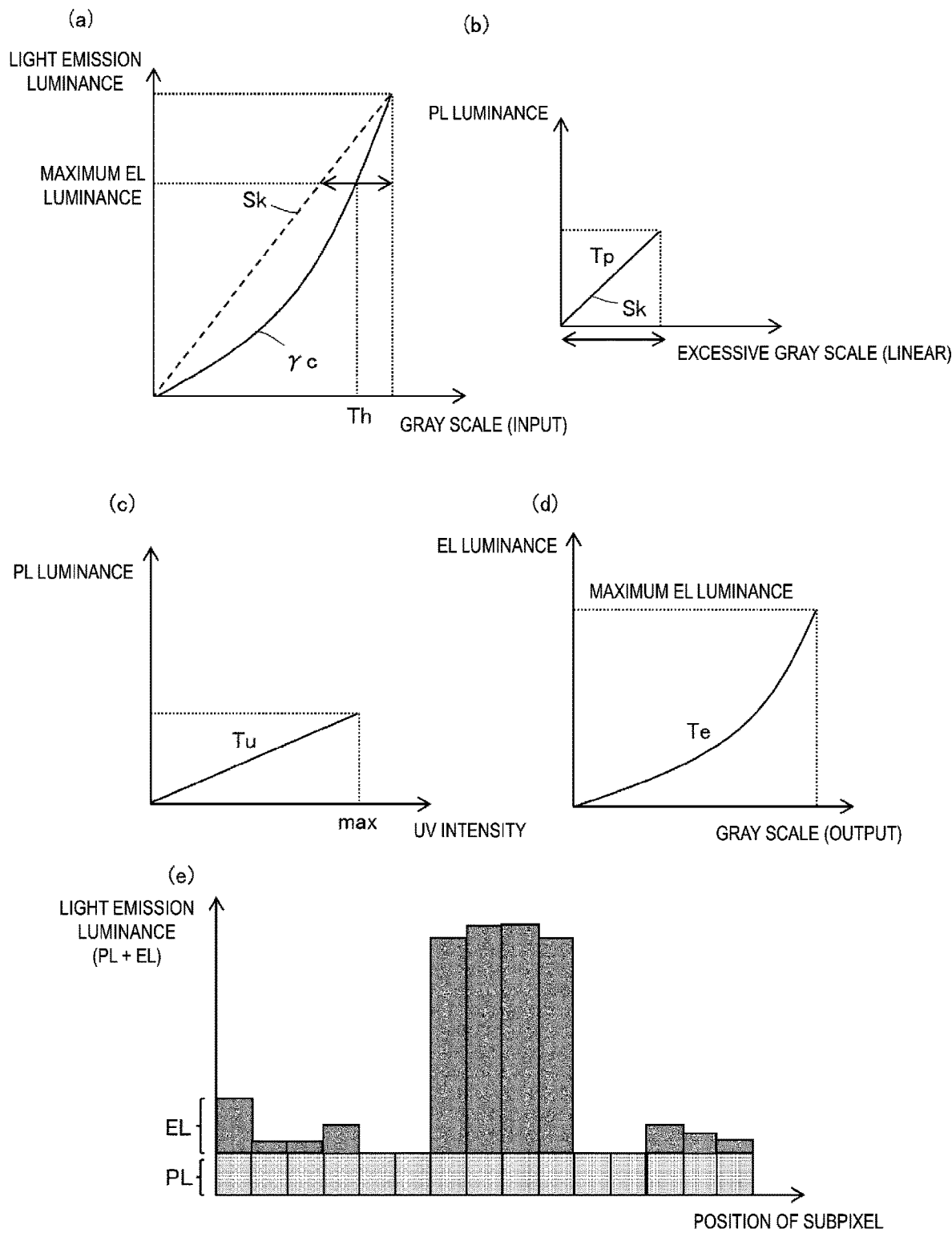

FIG. 16(a) is a graph showing a gray scale-light emission luminance characteristic of a subpixel, FIG. 16(b) is a graph showing a relationship between an excessive gray scale and a PL luminance, FIG. 16(c) is a graph showing a relationship between a UV intensity and a PL luminance, FIG. 16(d) is a graph showing a relationship between a gray scale and an EL luminance, and FIG. 16(e) is an explanatory diagram showing an example of a position of a subpixel and a light emission intensity.

Figure 17:
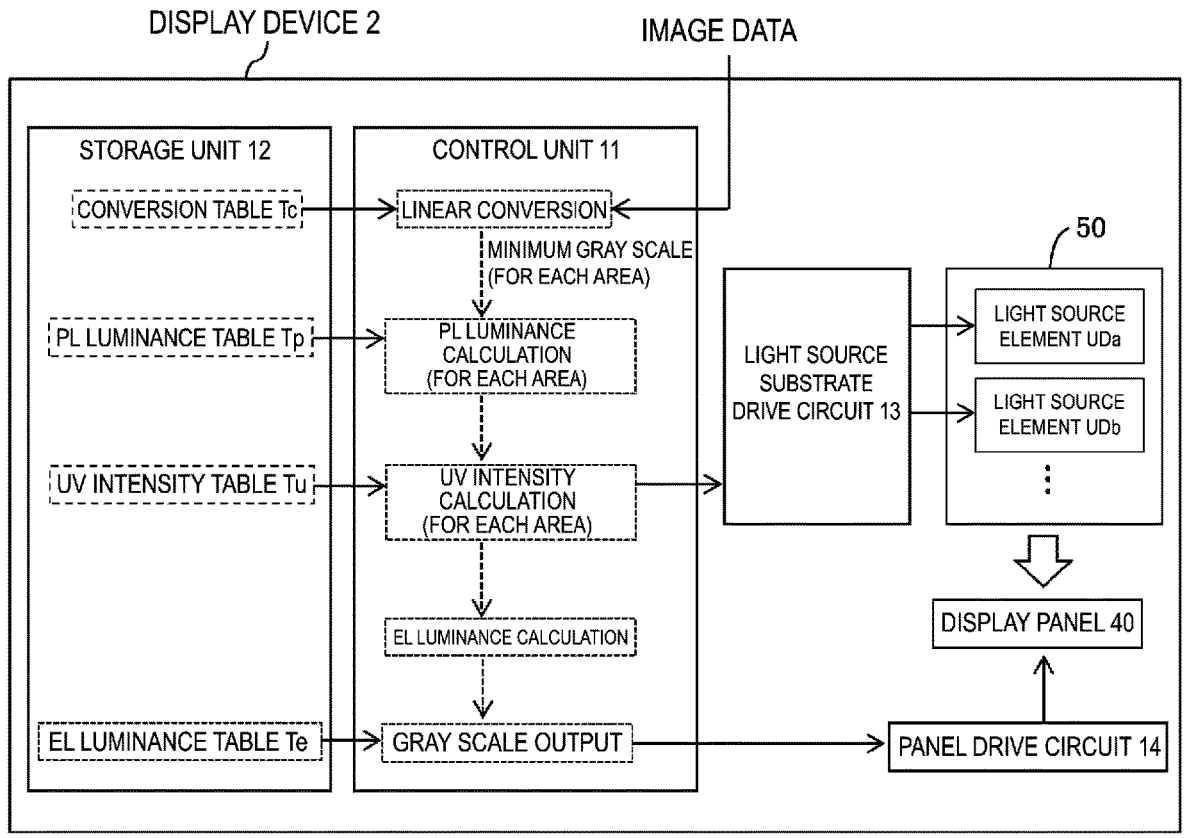
Figure 17:
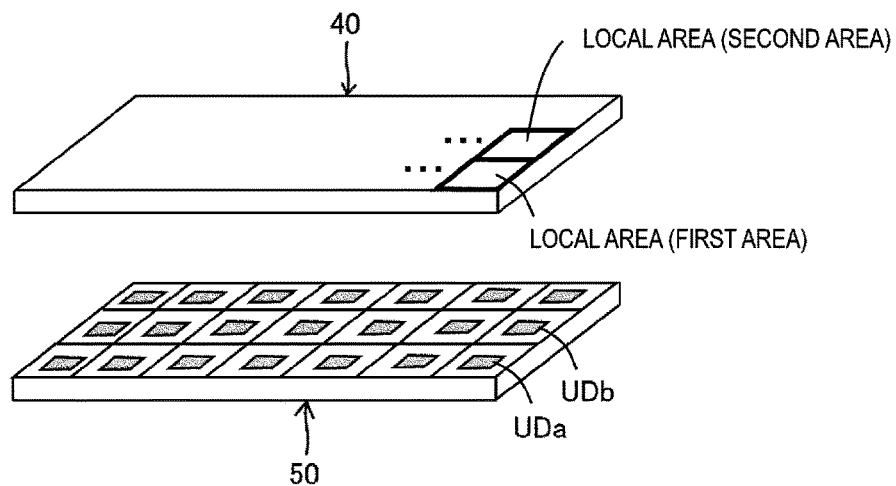

FIG. 17(a) is a block diagram illustrating the functions of units of a display device according to a fourth embodiment, and FIG. 17(b) is a schematic view illustrating an example of the display device according to the fourth embodiment.

FIG. 18(a) is a graph showing a gray scale-light emission luminance characteristic of a subpixel, FIG. 18(b) is a graph showing a relationship between a minimum linear gray scale and a PL luminance, FIG. 18(c) is a graph showing a relationship between a UV intensity and a PL luminance, FIG. 18(d) is a graph showing a relationship between a gray scale and an EL luminance, and FIG. 18(e) is an explanatory diagram showing an example of a position of a subpixel and a light emission intensity.

Figure 19:
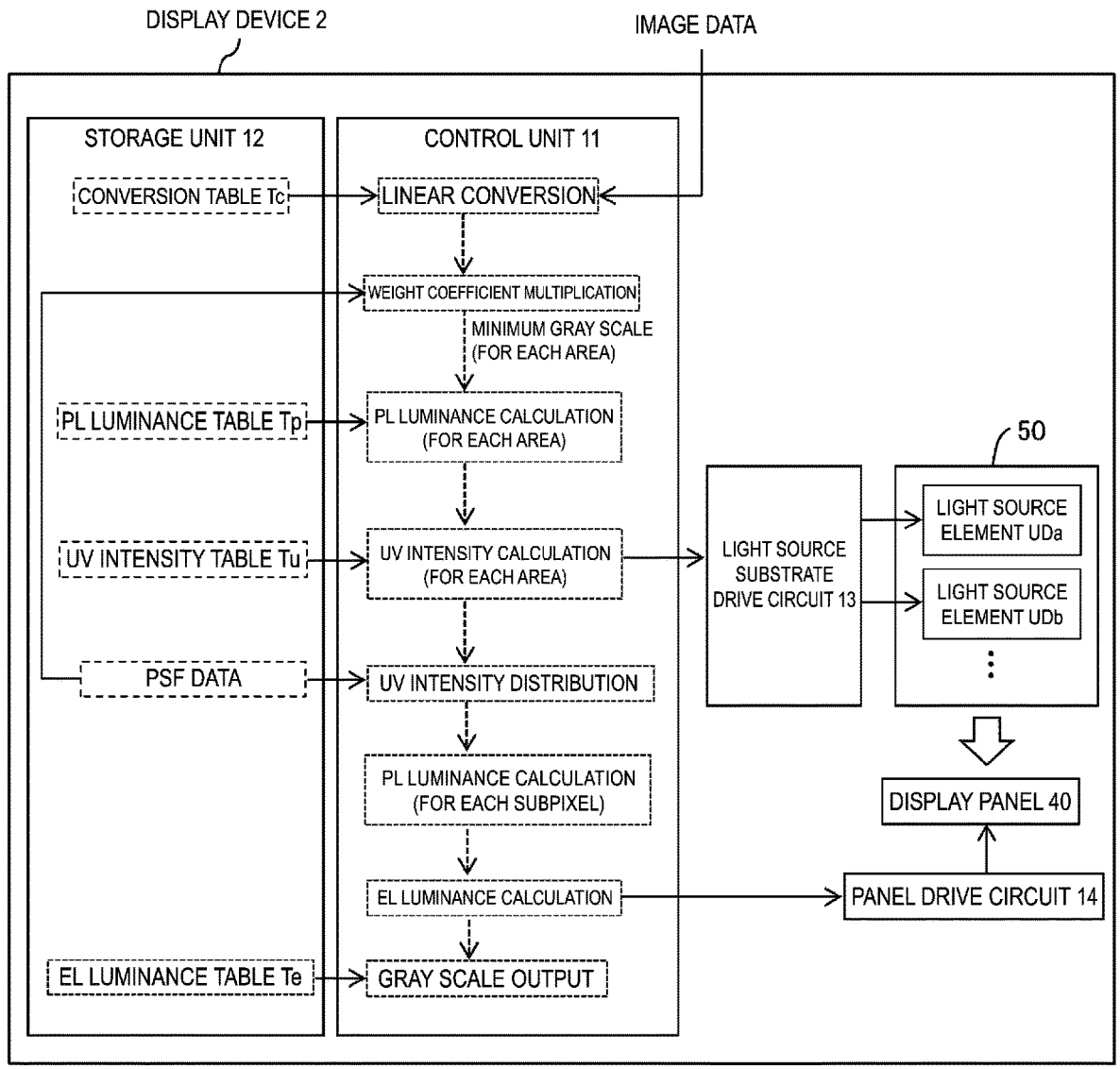

FIG. 19 is a block diagram illustrating another configuration of the display device according to the fourth embodiment.

FIG. 20(a) is a graph showing a gray scale-light emission luminance characteristic of a subpixel, and FIG. 20(b) is an explanatory diagram showing an example of a position of a subpixel and a light emission intensity.

DESCRIPTION OF EMBODIMENTS

Figure 1:
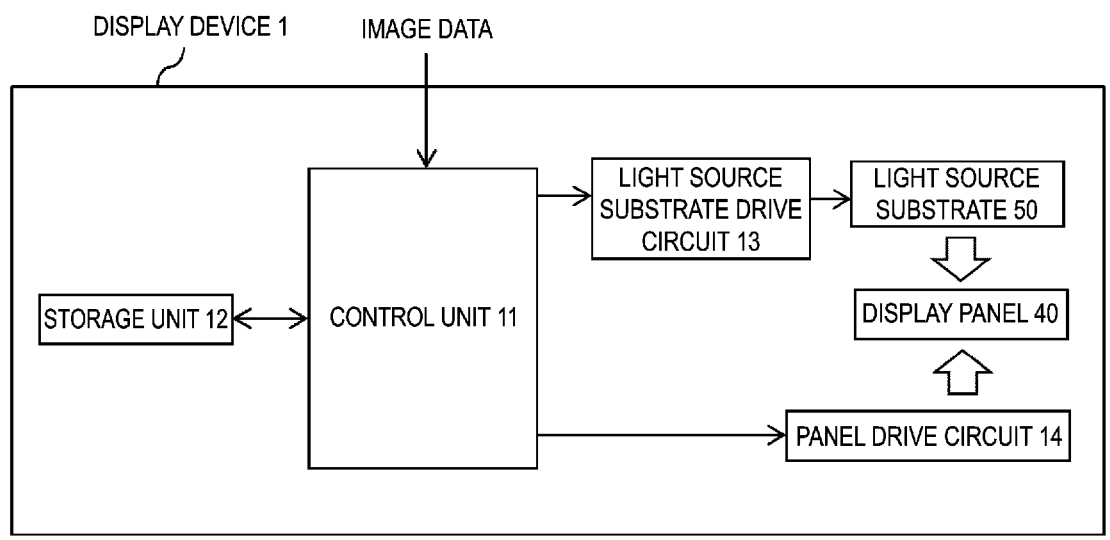
Figure 2:
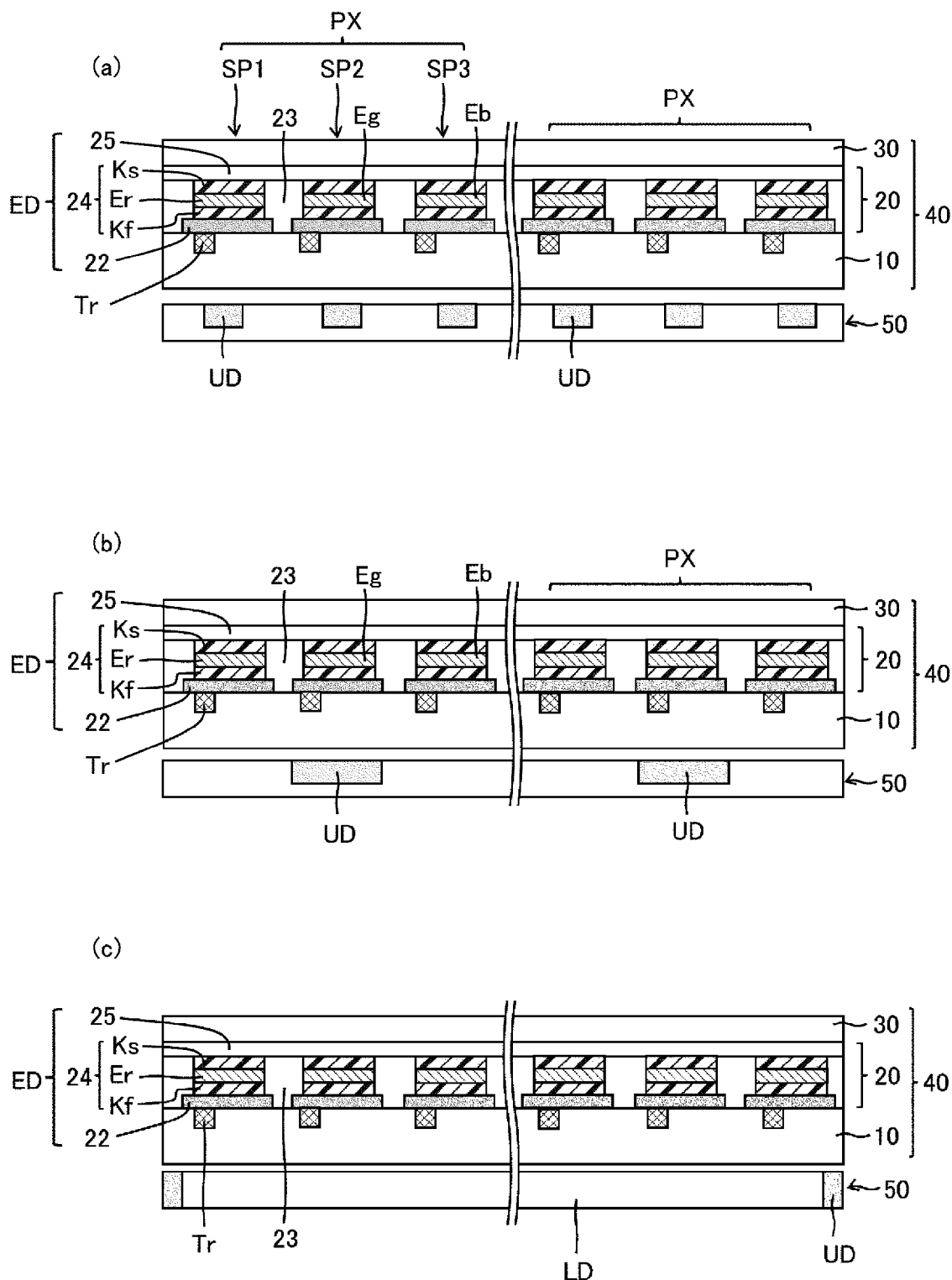

FIG. 1 is a block diagram illustrating a configuration of a display device according to the present embodiment. FIGS. 2(a) to (c) are cross-sectional views illustrating a configuration example of the display device according to the present embodiment. As illustrated in FIG. 1 and FIG. 2, the display device 1 includes a display panel 40 provided with a plurality of pixels PX, a light source substrate 50 provided at a back face side of the display panel 40 (at the opposite side to a viewing face) and including a light source element UD configured to emit ultraviolet light, a light source substrate drive circuit 13 configured to drive the light source substrate 50, a panel drive circuit 14 configured to drive the display panel 40, a control unit 11 configured to be input with image data and configured to control the light source substrate drive circuit 13 and the panel drive circuit 14, and a storage unit (memory) 12 connected to the control unit 11. The light source substrate 50 irradiates the display panel 40 with ultraviolet light. The control unit 11 includes a processor. Note that the storage unit 12 may be included in the control unit 11.

The display panel 40 includes a TFT substrate 10 provided with pixel circuits, and a light-emitting element layer 20 and a sealing layer 30 that are provided over the TFT substrate 10. The light-emitting element layer 20 includes first electrodes 22, an edge cover film 23, an active layer 24, and a second electrode 25. The sealing layer 30 is a layer that prevents penetration of a foreign matter such as water or oxygen.

The edge cover film 23 is an insulating film covering an edge of the first electrode 22. The active layer 24 includes a first charge function layer Kf, a quantum dot light-emitting layer Er, Eg, or Eb (a first quantum dot light-emitting layer), and a second charge function layer Ks. For example, the first electrode 22 may be an anode, the first charge function layer Kf may be a hole transport layer, the second charge function layer Ks may be an electron transport layer, and the second electrode 25 may be a cathode.

A light-emitting element ED is constituted by the first electrodes 22, the active layer 24, and the second electrode 25. The light-emitting element ED is a Quantum-dot Light-Emitting Diode (QLED) provided for each subpixel.

The display device 1 is a top emission (upward emission) type. The first electrode 22 has light reflectivity. The second electrode 25 has a light-transmitting property.

The quantum dot light-emitting layers Er, Eg, and Eb include quantum dots that emit light in a predetermined wavelength range. As a material of the quantum dot, a known material can be used, and examples thereof include CdSe, CdZnSe, InP, ZnSe, ZnS, ZnTe, ZnTeSe, Si, and CdS. The quantum dot has a core-shell structure including a core and a shell covering the core.

Examples of a material of the hole transport layer include benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives of these materials, linear conjugated organic monomers, oligomers, or polymers of a polysilane-based compound, a vinylcarbazole-based compound, a thiophene-based compound, an aniline-based compound, or the like, and inorganic compounds such as nickel oxide, tungsten oxide, titanium oxide, and cesium oxide that can be used for forming a film from a solution thereof.

Examples of a material for the electron transport layer include organic compounds such as Alq, $Alq_3$, and BCP, and inorganic compounds (that may be in the form of nanoparticles) such as ZnO (to which Al, Mg, Li, Ga, or the like may be added), $SnO_2$, and $In_2O_3$.

Examples of a material of the first electrode 22 and the second electrode 25 include Al, Ag, Mg, ITO, and IZO.

The display device 1 includes a subpixel SP1 that emits red light, a subpixel SP2 that emits green light, and a subpixel SP3 that emits blue light. Each of the subpixel SP1, the subpixel SP2, and the subpixel SP3 includes a light-emitting element ED. The quantum dot light-emitting layer Er of the subpixel SP1 emits red light, the quantum dot light-emitting layer Eg of the subpixel SP2 emits green light, and the quantum dot light-emitting layer Eb of the subpixel SP3 emits blue light.

The light source element UD irradiates the light-emitting element layer (in particular, the quantum dot light-emitting layers Er, Eg, and Eb) with ultraviolet light. The quantum dot light-emitting layers Er, Eg, and Eb exhibit ElectroLuminescence (EL) by voltage application, and exhibit PhotoLuminescence (PL) by UV irradiation.

The light source element UD is constituted by a Light-Emitting Diode (LED), an Organic Light-Emitting Diode ((SLED), a Quantum-dot Light-Emitting Diode (QLED), an excimer lamp, or the like that emits ultraviolet light with a wavelength of about from 350 to 400 nm.

The light source element UD may be provided to correspond to each subpixel as illustrated in FIG. 2(a), or may be provided to correspond to a plurality of subpixels as illustrated in FIG. 2(b). Further, as illustrated in FIG. 2(c), the light source elements UD may be arranged below facing edges of the display panel 40, and light from the light source elements UD may be guided to a display region by a light guide plate LD.

The light source substrate drive circuit 13 may perform individual control (intensity control) of each of the plurality of light source elements UD, or may collectively control all the light source elements UD of the light source substrate 50. Alternatively, control may be performed for each group constituted by a plurality of light source elements.

Figure 3:
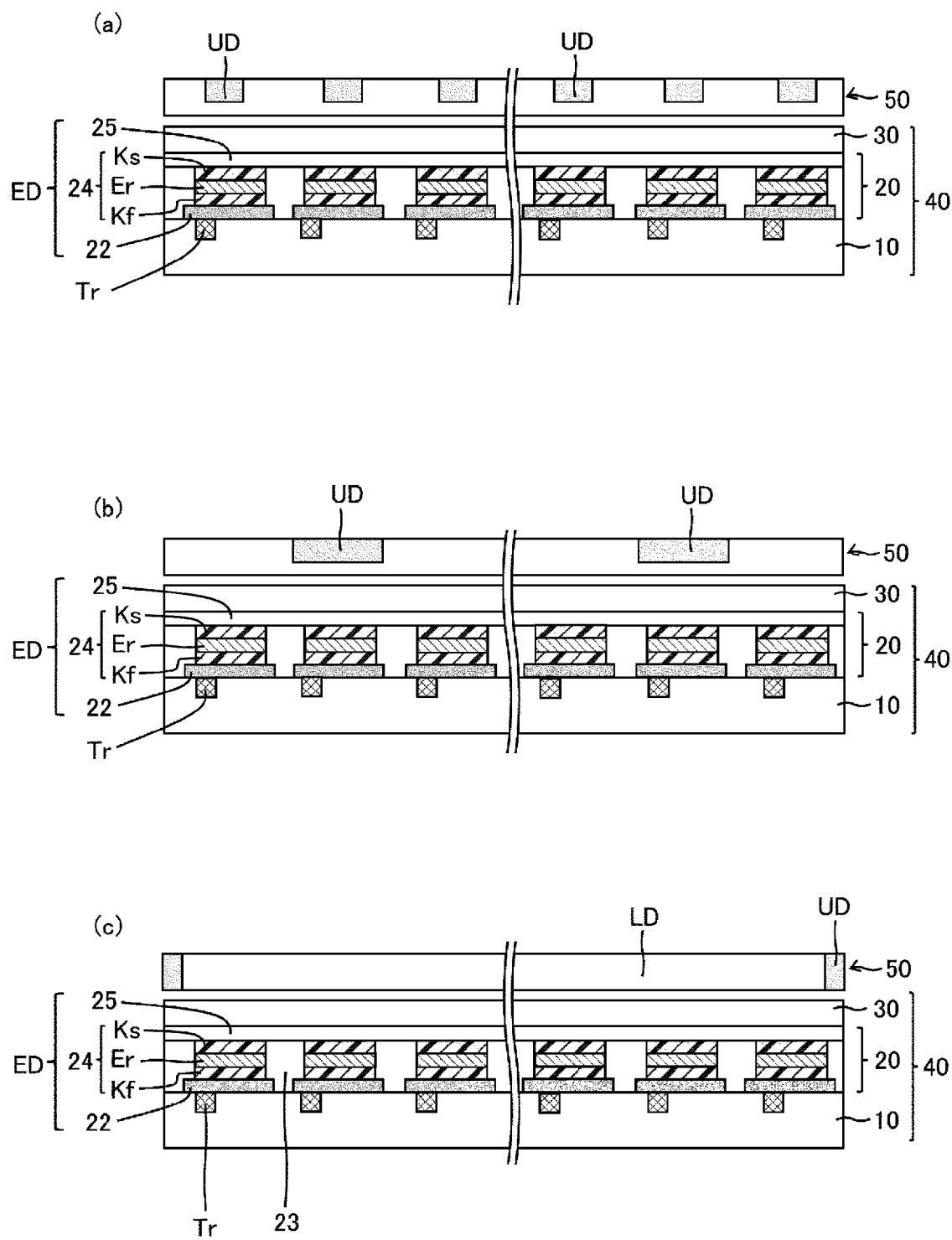

FIGS. 3(a) to (c) are cross-sectional views illustrating another configuration example of the display device according to the present embodiment. In FIG. 2, although the light source substrate 50 is disposed at the back face side of the display panel 40, no such limitation is intended. As illustrated in FIGS. 3(a) to (c), the light source substrate 50 may be disposed at the viewing face side of the display panel 40. Note that the light source substrate 50 illustrated in FIGS. 3(a) to (c) has a light-transmitting property.

Figure 4:
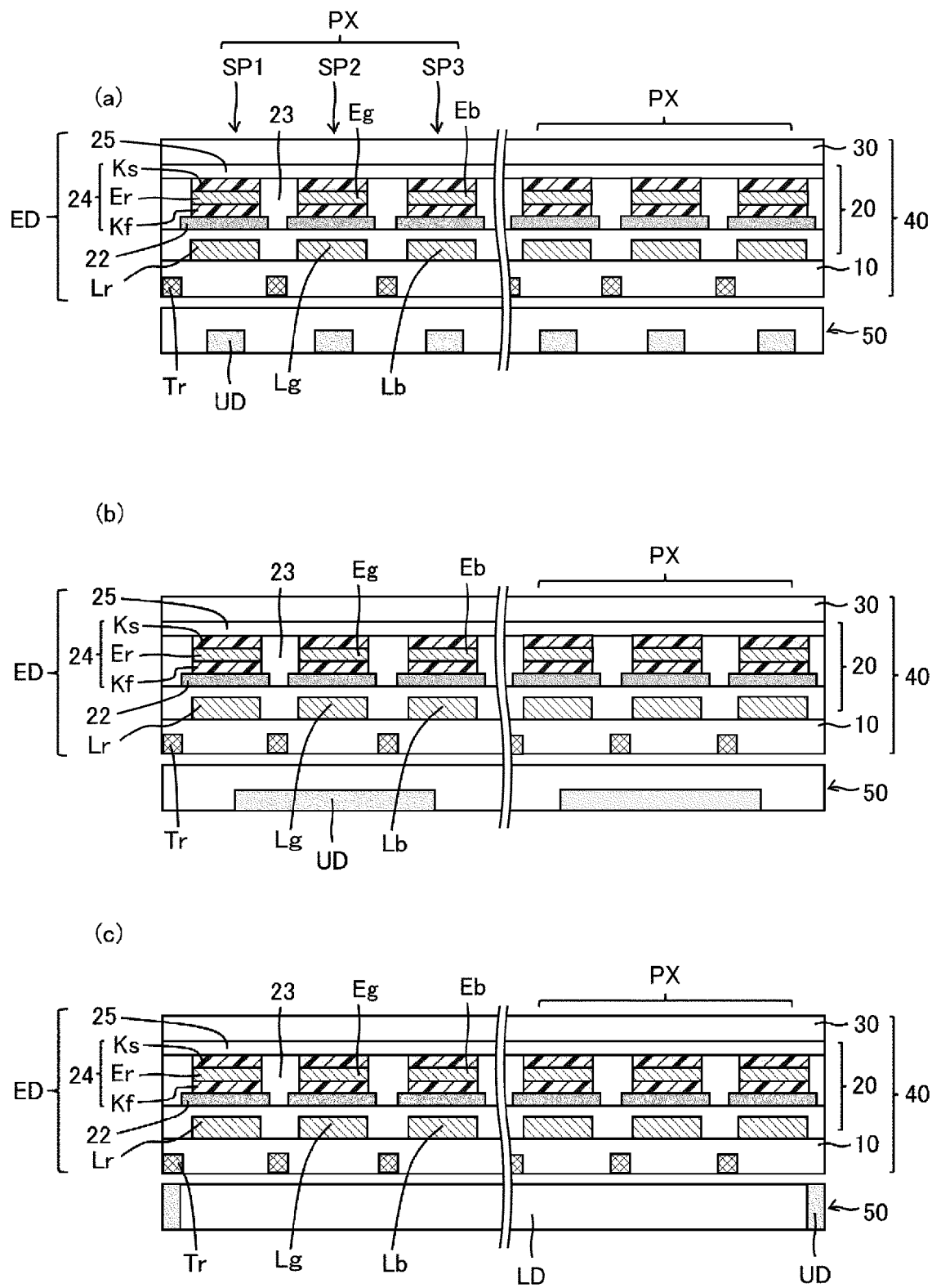

FIGS. 4(a) to (c) are cross-sectional views illustrating another configuration example of the display device according to the present embodiment. In FIG. 4, the light-emitting element layer 20 of the subpixel SP1 is provided with the quantum dot light-emitting layer Er for EL (first quantum dot light-emitting layer) and the quantum dot light-emitting layer Lr for PL (second quantum dot light-emitting layer), the light-emitting element layer 20 of the subpixel SP2 is provided with the quantum dot light-emitting layer Eg for EL (first quantum dot light-emitting layer) and the quantum dot light-emitting layer Lg for PL (second quantum dot light-emitting layer), and the light-emitting element layer 20 of the subpixel SP3 is provided with the quantum dot light-emitting layer Eb for EL (first quantum dot light-emitting layer) and the quantum dot light-emitting layer Lb for PL (second quantum dot light-emitting layer). It is desirable that the quantum dot light-emitting layers Lr, Lg, and Lb be formed thicker than the quantum dot light-emitting layers Er, Eg, and Eb to enhance the efficiency of photoluminescence.

The quantum dot light-emitting layers Er, Eg, and Eb for EL are applied with a voltage, and are not irradiated with ultraviolet light. The quantum dot light-emitting layers Lr, Lg, and Lb for PL are irradiated with ultraviolet light, and are not applied with a voltage.

The light source element LTD may be provided to correspond to each subpixel as illustrated in FIG. 4(a), or may be provided to correspond to a plurality of subpixels as illustrated in FIG. 4(b). Further, as illustrated in FIG. 4(c), the light source elements UD may be disposed below the facing edges of the display panel 40, and light from the light source elements UD may be guided to the display region by the light guide plate LD.

The light source substrate drive circuit 13 may perform individual control (intensity control) of each of the plurality of light source elements UD, or may collectively control all the light source elements UI) of the light source substrate 50. Alternatively, control may be performed for each group constituted by a plurality of light source elements.

The quantum dot light-emitting layer Lr emits red photoluminescence when receiving ultraviolet irradiation from the light source substrate 50, the quantum dot light-emitting layer Lg emits green photoluminescence when receiving ultraviolet irradiation from the light source substrate 50, and the quantum dot light-emitting layer Lb emits blue photoluminescence when receiving ultraviolet irradiation from the light source substrate 50.

Figure 5:
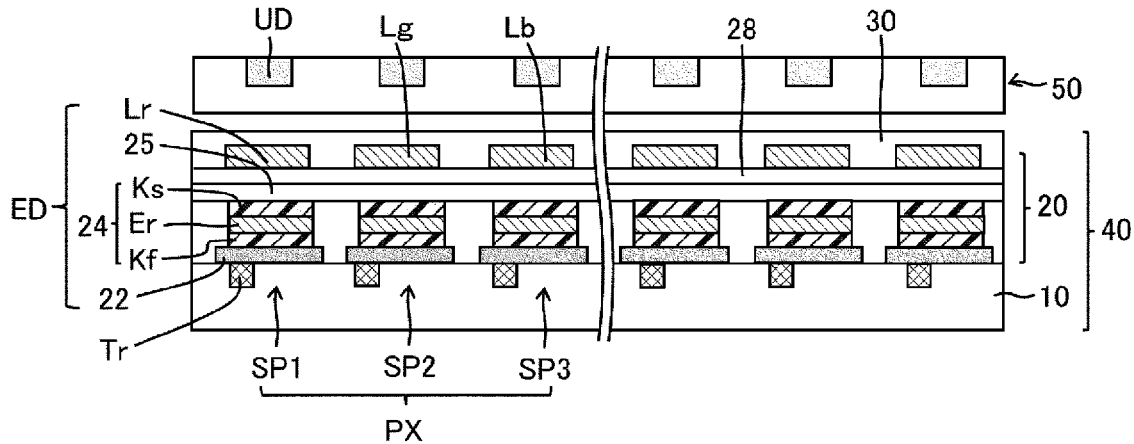
Figure 5:
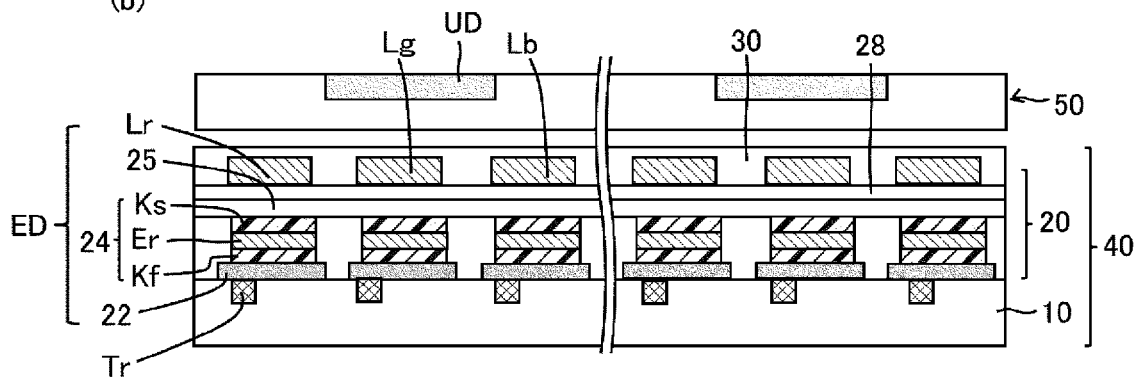
Figure 5:
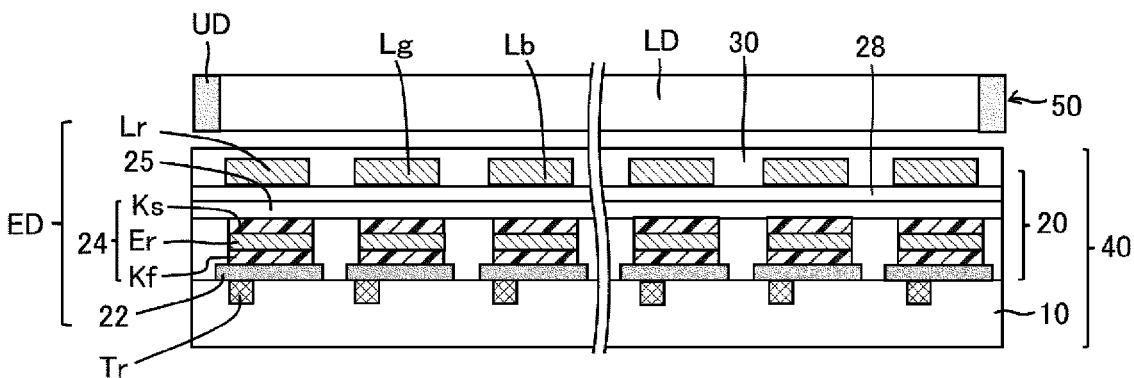

FIGS. 5(a) to (c) are cross-sectional views illustrating another configuration example of the display device according to the present embodiment. In FIG. 4, although the light source substrate 50 is disposed at the back face side of the display panel 40, no such limitation is intended. As illustrated in FIGS. 5(a) to (c), the light source substrate 50 may be disposed at the viewing face side of the display panel 40. Note that the light source substrate 50 illustrated in FIGS. 5(a) to (c) has a light-transmitting property.

Figure 6:
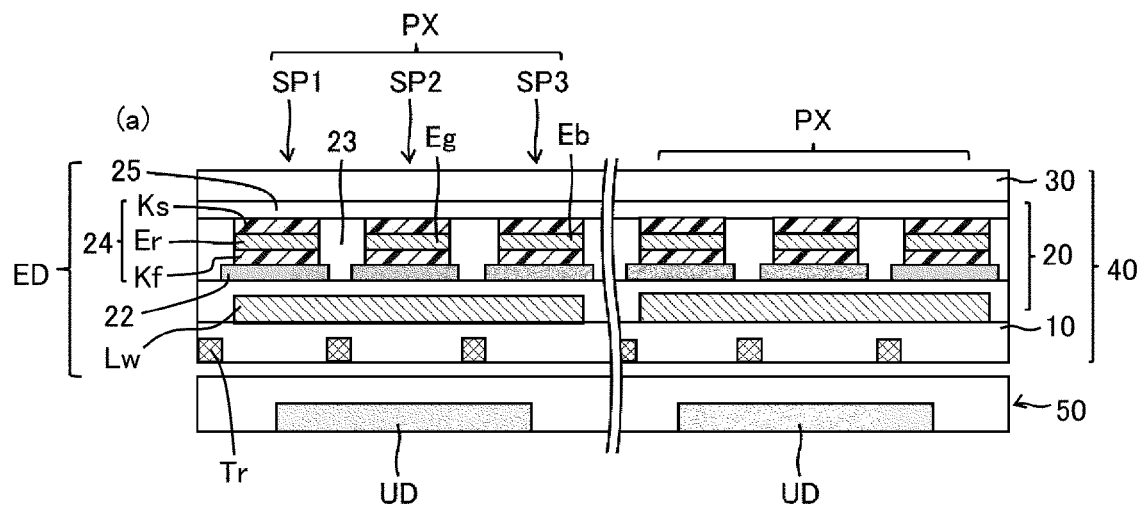
Figure 6:
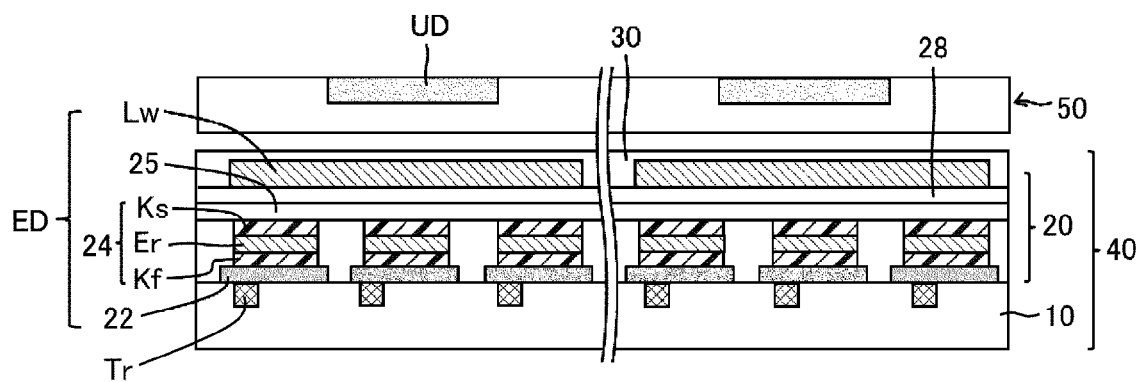

FIGS. 6(a) and (b) are cross-sectional views illustrating another configuration example of the display device according to the present embodiment. In FIG. 6, the light-emitting element layer 20 of the pixel PX is provided with the quantum dot light-emitting layers Er, Eg, and Eb for EL (first quantum dot light-emitting layers) and a quantum dot light-emitting layer Lw for PL (second quantum dot light-emitting layer). It is desirable that the quantum dot light-emitting layer Lw be formed thicker than the quantum dot light-emitting layers Er, Eg, and Eb to enhance the efficiency of photoluminescence.

The light source substrate drive circuit 13 may perform individual control (intensity control) of each of the plurality of light source elements UD, or may collectively control all the light source elements LTD of the light source substrate 50. Alternatively, control may be performed for each group constituted by a plurality of light source elements. The light source element UD is provided corresponding to a plurality of subpixels. The quantum dot light-emitting layer Lw emits white PL (white light) by receiving ultraviolet irradiation from the light source substrate 50. As for the white light, a red color component contributes to the luminance of the subpixel SP1, a green color component contributes to the luminance of the subpixel SP2, and a blue color component contributes to the luminance of the subpixel SP3.

In FIG. 6(a), the light source substrate 50 is disposed at the back face side of the display panel 40, but no such limitation is intended. As illustrated in FIG. 6(b), the light source substrate 50 may be disposed at the viewing face side of the display panel 40. Note that the light source substrate 50 illustrated in FIG. 6(h) has a light-transmitting property.

Figure 7:
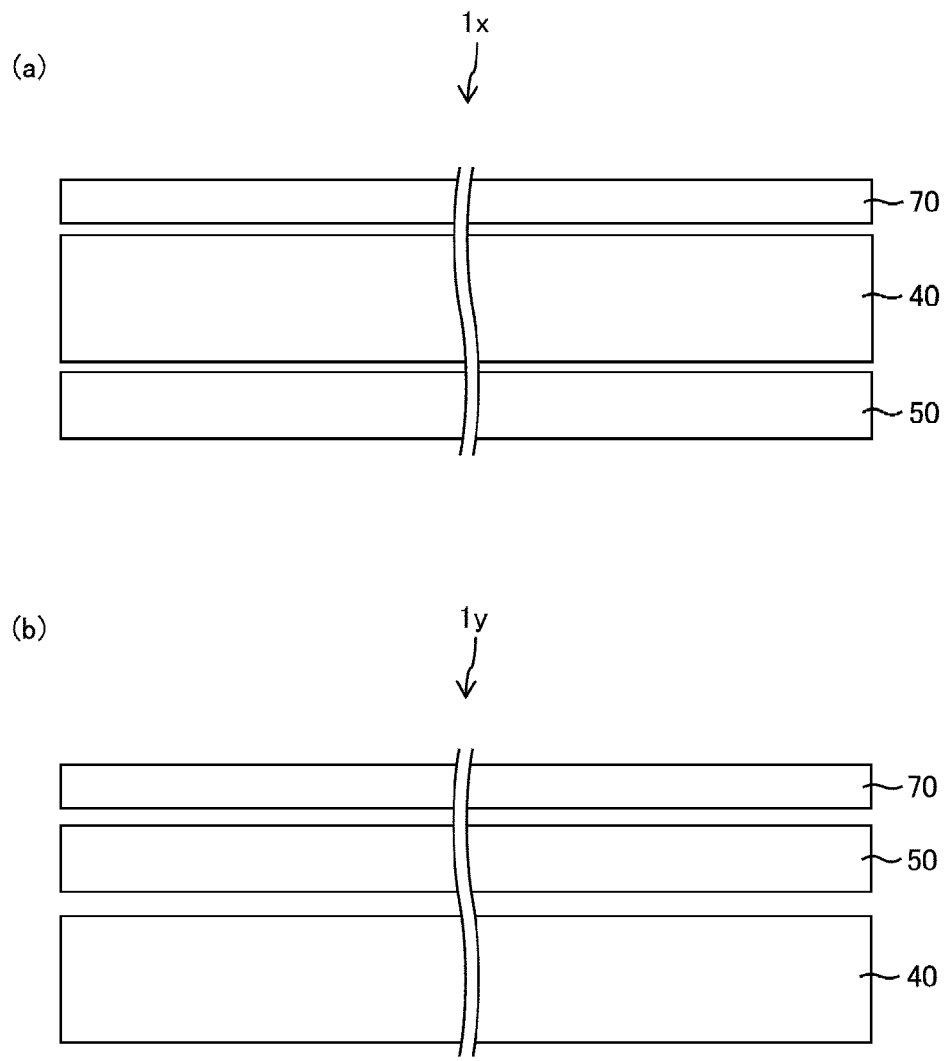

FIGS. 7(a) and (b) are cross-sectional views illustrating another configuration example of the display device according to the present embodiment. In the present embodiment, as illustrated in FIG. 7(a), in the configuration in which the light source substrate 50 is disposed at the back face side of the display panel 40, it is desirable to provide an ultraviolet cut filter 70 at the viewing face side of the display panel 40. In addition, as illustrated in FIG. 7(b), in the configuration in which the light source substrate 50 is disposed at the viewing face side of the display panel 40, it is desirable to provide the ultraviolet cut filter 70 at the viewing face side of the light source substrate 50. In this way, it is possible to prevent a viewer from receiving ultraviolet light. In addition, the influence of external light (ultraviolet light) can be reduced. Note that the light source substrate 50 illustrated in FIG. 7(b) has a light-transmitting property.

Figure 8:
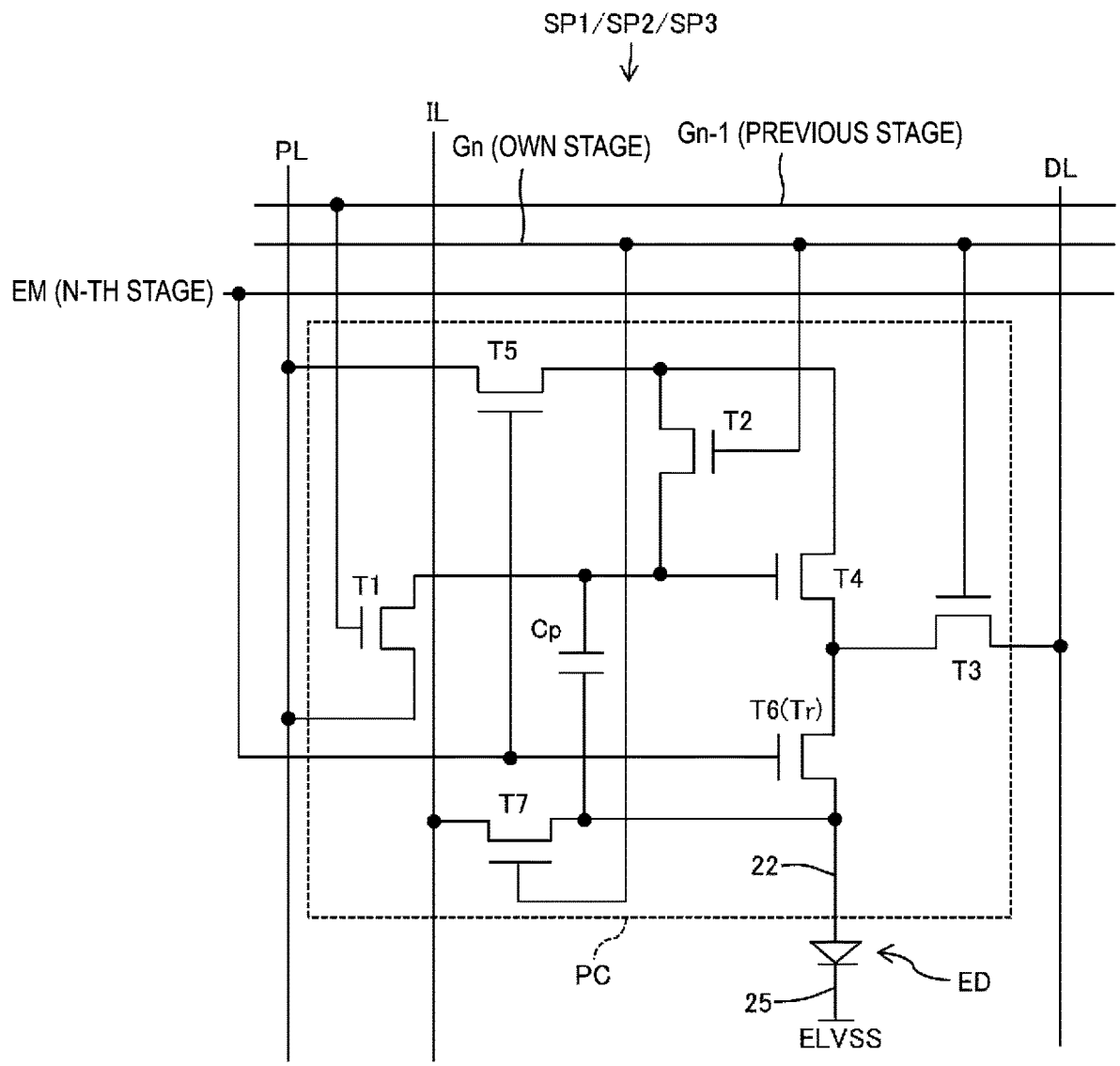
FIG. 8 is a circuit diagram illustrating a configuration example of a subpixel.

FIG. 8 is a circuit diagram illustrating a configuration example of a subpixel. Each of the subpixels (SP1, SP2, and SP3) of the display panel 40 includes the light-emitting element EL) and a pixel circuit PC connected to the light-emitting element ED. The pixel circuit PC includes a capacitance element Cp, a reset transistor T1 including a gate terminal connected to a scanning signal line Gn−1 at the previous stage, a threshold value control transistor T2 including a gate terminal connected to a scanning signal line Gn at the own stage, a writing control transistor T3 including a gate terminal connected to the scanning signal line Gn at the own stage, a drive transistor T4 that controls a current of the light-emitting element ED, a power supply transistor T5 including a gate terminal connected to a light emission control line EM, a light emission control transistor 16 including a gate terminal connected to the light emission control line EM, and an initialization transistor 17 including a gate terminal connected to the scanning signal line Gn at the own stage.

The gate terminal of the drive transistor 14 is connected to an anode of the light-emitting element ED via the capacitance element Cp, and is connected to a high-potential side power source line PL via the reset transistor T1. A high-potential side power supply (ELVDD) is supplied to the high-potential side power source line PL.

A source terminal of the drive transistor 14 is connected to a data signal line DL via the writing control transistor T3, and is connected to the anode (first electrode 22) of the light-emitting element ED via the light emission control transistor 16 (transistor Tr in FIG. 2). A drain terminal of the drive transistor 14 is connected to the gate terminal of the drive transistor T4 via the threshold value control transistor T2, and is connected to the high-potential side power source line PL via the power supply transistor T5.

The anode of the light-emitting element ED is connected to an initialization signal line IL via the initialization transistor T7. A low-potential side power supply (ELVSS) is supplied to the initialization signal line IL and a cathode (the second electrode 25) of the light-emitting element EL).

The scanning signal lines Gn and Gn−1, the data signal line DL, the light emission control line EM, the high-potential side power source line PL, and the initialization signal line IL are connected to the panel drive circuit 14 illustrated in FIG. 1.

Figure 9:
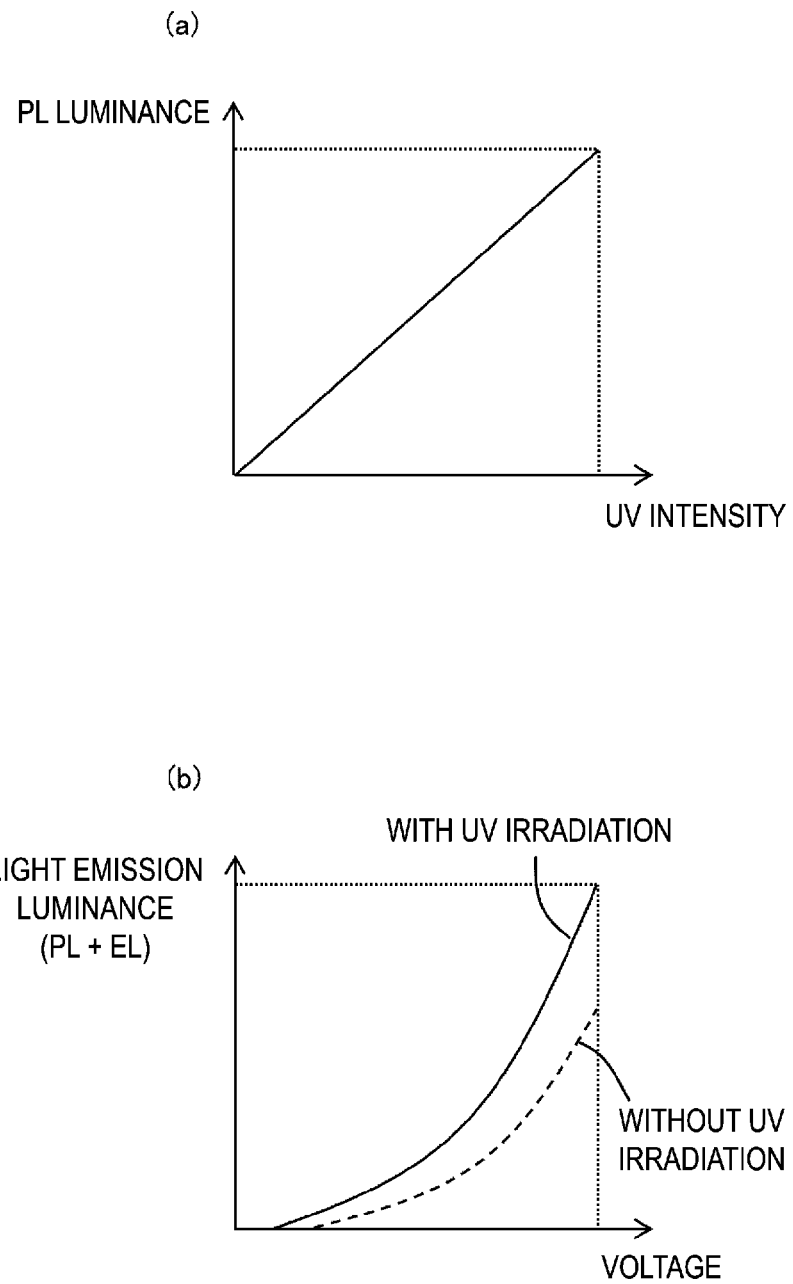
FIG. 9(a) is a graph showing a UV intensity-PL luminance characteristic of the light-emitting element.
FIG. 9(b) is a graph showing a gray scale-light emission luminance characteristic of the light-emitting element.

FIG. 9(a) is a graph showing a UV intensity-PL luminance characteristic of the light-emitting element, and FIG. 9(b) is a graph showing a gray scale-light emission luminance characteristic of the light-emitting element. A light emission luminance is a luminance (PL luminance+EL luminance) of the light-emitting element. In the present embodiment, voltage application and ultraviolet irradiation (UV irradiation) are performed from the light source substrate 50 to the light-emitting element layer 20 of the display panel 40. The light-emitting element layer 20 exhibits ElectroLuminescence (EL) by the voltage application and exhibits PhotoLuminescence (PL) by the UV irradiation. As shown in FIG. 9(a), the PL luminance (the luminance of photoluminescence) increases as the UV intensity increases. That is, in the present embodiment, the luminous efficiency of the light-emitting element ED can be enhanced, and as shown in FIG. 9(b), a light emission luminance can be increased without changing a voltage between the anode and the cathode in the light-emitting element ED, or the voltage between the anode and the cathode can be decreased while the light emission luminance is being maintained. Thereby, the display device with a high luminance or a low consumption power can be implemented.

First Embodiment

In a first embodiment, in each subpixel, a low gray scale region is expressed by the photoluminescence of the light-emitting element, and the other gray scale regions are expressed by the photoluminescence and electroluminescence of the light-emitting element. In the display device according to the first embodiment, the light source element UD is provided for each subpixel (see FIG. 2(a), FIG. 3(a), FIG. 4(a), FIG. 5(a), and FIG. 7), and each light source element UD is individually controlled. For each of the plurality of subpixels, when an input gray scale is equal to or less than a predetermined gray scale, an intensity of ultraviolet light is set to a value corresponding to the input gray scale, and when the input gray scale exceeds the predetermined gray scale, the intensity of ultraviolet light is set to a maximum value, and an application voltage according to the input gray scale and the maximum value is applied to the light-emitting element ED.

Figure 10:
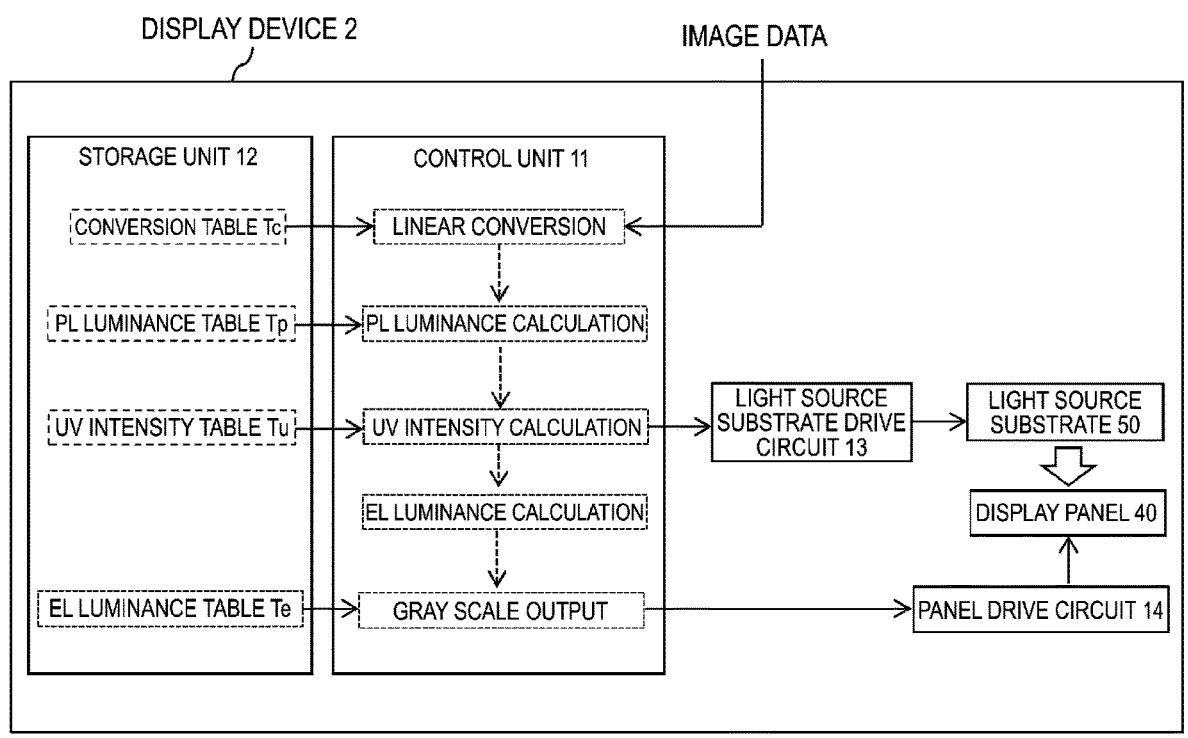
FIG. 10 is a block diagram illustrating the functions of units of a display device according to a first embodiment.

FIG. 10 is a block diagram illustrating the functions of units of the display device according to the first embodiment. FIG. 11(a) is a graph showing a gray scale-light emission luminance characteristic of a subpixel, FIG. 11(b) is a graph showing a relationship between a linear gray scale and a PL luminance, FIG. 11(c) is a graph showing a relationship between a UV intensity and a PL luminance, FIG. 11(d) is a graph showing a relationship between a gray scale and an luminance, and FIG. 11(e) is an explanatory diagram showing an example of a position of a subpixel and a light emission intensity.

The control unit 11 linearly converts input image data (an input gray scale) by using a conversion table Tc (for example, converts an input gray scale Ti into a linear gray scale Tj), and calculates a PL luminance based on the converted linear gray scale (Tj) and the PL luminance table Tp.

As shown in FIG. 11(a), the conversion table Tc can be obtained by projecting a gamma curve γc (the gray scale-light emission luminance characteristic) onto a linear function Sk (intersecting with the gamma curve γc at the minimum and maximum gray scales). When the input gray scale is equal to or less than a predetermined gray scale To, a region is determined to be a low gray scale region. The predetermined gray scale To is smaller than, for example, an intermediate value (for example, 128 gray scales) between 0 gray scale and the maximum gray scale (for example, 256 gray scales).

For example, as shown in FIG. 11(a) as an example, the PL luminance table Tp is created such that the PL luminance linearly increases to a maximum value Lo according to the linear function Sk in response to a change in the linear gray scale from 0 to Tz (a linear conversion value of the predetermined gray scale To), and the PL luminance is constant at the maximum value Lo when the linear gray scale becomes equal to or larger than Tz.

Next, the control unit 11 calculates the UV intensity based on the calculated PL luminance and the UV intensity table Tu, calculates the EL luminance by subtracting the PL luminance from the light emission luminance (for example, Lj) corresponding to the linear gray scale, and obtains an output gray scale based on the calculated EL luminance and an EL luminance table Te.

The control unit 11 controls the light source substrate drive circuit 13 based on the calculated UV intensity, and controls the panel drive circuit 14 based on the obtained output gray scale. The panel drive circuit 14 writes a data signal corresponding to the output gray scale to the subpixel, and an application voltage corresponding to the data signal is applied to the light-emitting element ED (between the first and second electrodes).

The UV intensity table Tu is created, for example, by measuring a light emission luminance while changing the UV intensity in a state where the gray scale is set to 0 (no voltage is applied to the light-emitting element) (in a state where electroluminescence does not occur). In a case where the PL luminance when the UV intensity is maximized is Lo and the input gray scale exceeds the predetermined gray scale To (a case where the region is not the low gray scale region), the UV intensity becomes the maximum value (max).

It is desirable to prepare a set of the conversion table Tc, the PL luminance table Tp, the UV intensity table Tu, and the EL luminance table Te for each luminescent color of a subpixel.

In addition, the UV irradiation to the light-emitting element ED may affect electroluminescence. Thus, it is desirable to create the EL luminance table Te for each level of the UV intensity and then, select the EL luminance table Te corresponding to the UV intensity (in particular, the configurations in FIG. 2 and FIG. 3). In this case, the EL luminance table Te can be created by measuring the light emission luminance while changing the gray scale (the data signal) during performing the UV irradiation, and subtracting an PL luminance part due to the UV irradiation.

In the first embodiment, as shown in FIG. 11(e), in each subpixel, the low gray scale region that is difficult to be expressed by electroluminescence can be expressed by photoluminescence, so that the gray scale reproducibility of the low gray scale region can be enhanced (for example, a smooth display can be achieved). In addition, since electroluminescence of the light-emitting element is reduced, the present embodiment is also effective for extending the lifetime.

FIG. 12(a) shows a modified example of the PL luminance table, FIG. 12(b) shows an EL luminance characteristic when the PL luminance table in FIG. 12(a) is used, and FIG. 12(c) shows a light emission luminance (PL luminance+EL luminance) characteristic when the PL luminance table in FIG. 12(a) is used. In FIG. 12(a), the PL luminance is increased from the 0 gray scale, gradually decreased from a gray scale Tx (>0), temporarily dropped to 0 at a gray scale Tz, increased again after the gray scale Tz (>Tx) to the maximum value Lo at a gray scale Ty (>Tz), and kept constant from the gray, scale Tz to the maximum gray scale. In this case, the EL luminance is set to 0 up to the gray scale Tx, steeply increased from the gray scale Tx to the gray scale Tz, gently increased from the gray scale Tz to the gray scale Ty, and steeply increased from the gray scale Ty to the maximum gray scale. In this way, as shown in FIG. 12(c), the light emission luminance that is the sum of the PL luminance and the EL luminance can be linearly changed with respect to the linear gray scale.

Second Embodiment

In a second embodiment, a minimum luminance of each image is expressed by the photoluminescence of the light-emitting element, and an insufficient luminance is expressed by the electroluminescence of the light-emitting element. The display device according to the second embodiment has a configuration in which the light source element UD is provided corresponding to one or a plurality of subpixels (see FIG. 2 to FIG. 7) and the light source elements UD are collectively controlled. The intensity of ultraviolet light is set to a value corresponding to a minimum input gray scale of the plurality of subpixels, and an application voltage corresponding to an input gray scale and the intensity of the ultraviolet light is applied to the light-emitting element ED of each of the plurality of subpixels.

FIG. 13 is a block diagram illustrating the functions of units of the display device according to the second embodiment. FIG. 14(a) is a graph showing a gray scale-light emission luminance characteristic of a subpixel, FIG. 14(b) is a graph showing a relationship between a minimum linear gray scale and a PL luminance, FIG. 14(c) is a graph showing a relationship between a UV intensity and a PL luminance, FIG. 14(d) is a graph showing a relationship between a gray scale and an EL luminance, and FIG. 14(e) is an explanatory diagram showing an example of a position of a subpixel and a light emission intensity.

The control unit 11 linearly converts input image data (an input gray scale) by using a conversion table Tc (for example, converts an input gray scale Ti into a linear gray scale Tj), and calculates a PL luminance (corresponding to the minimum luminance in an image) corresponding to the minimum linear gray scale based on the linear conversion value (minimum linear gray scale) of the minimum input gray scale that is the darkest gray scale in the image and the PL luminance table Tp.

As shown in FIG. 14(a), the conversion table Tc is obtained by projecting a gamma curve γc (a gray scale-light emission luminance characteristic) onto a linear function Sk (intersecting with the gamma curve γc at minimum and maximum gray scales). The PL, luminance table Tp is created such that a PL luminance linearly increases according to the linear function Sk in response to a change in the minimum linear gray scale from 0 to the maximum gray scale.

Next, the control unit 11 calculates a UV intensity based on the calculated PL luminance and the UV intensity table Tu, calculates an EL luminance by subtracting the PL luminance from a light emission luminance (for example, Lj) for the linear gray scale (when the calculation result is negative, the EL luminance is set to 0), and obtains an output gray scale based on the calculated EL luminance and the EL luminance table Te. Note that when a relationship between the UV intensity and the PL luminance becomes non-linear, the UV intensity table Tu shown in another example of FIG. 14(c) may be used.

The control unit 11 controls the light source substrate drive circuit 13 based on the calculated UV intensity, and controls the panel drive circuit 14 based on the obtained output gray scale. The panel drive circuit 14 writes a data signal corresponding to the output gray scale to the subpixel, and an application voltage corresponding to the data signal is applied to the light-emitting element EL) (between the first and second electrodes).

It is desirable to prepare a set of the conversion table Tc, the PL luminance table Tp, the UV intensity table Tu, and the EL luminance table Te for each luminescent color of a subpixel.

For example, when the minimum input gray scale is the first subpixel SP1, a UV intensity is calculated by using the conversion table Tc, the PL luminance table Tp, the UV intensity table Tu for red light emission. On the other hand, for the second subpixel SP2, a PL luminance is calculated based on the UV intensity and the UV intensity table Tu for green light emission, and for the third subpixel SP3, a PL luminance is calculated based on the UV intensity and the UV intensity table Tu for blue light emission.

In the configuration using the quantum dot light-emitting layer Lw (see FIG. 6), a PL luminance in the UV intensity table Tu is a wavelength component of each color (red, green, and blue) in white light.

In addition, the UV irradiation to the light-emitting, element ED may affect electroluminescence. Thus, it is desirable to create the EL luminance table Te for each level of the UV intensity and then, select the EL luminance table Te corresponding to the UV intensity (in particular, the configurations in 2 and FIG. 3).

In the second embodiment, as illustrated in FIG. 13(e), since a minimum luminance of each image is set to a common photoluminescence luminance among the subpixels, the electroluminescence of the light-emitting element can be reduced and the lifetime can be extended.

Third Embodiment

In a third embodiment, when a luminance exceeding the maximum luminance of electroluminescence is required in an HDR image or the like, an insufficient luminance is compensated by photoluminescence of a light-emitting element. In the display device according to the third embodiment, the light source element LTD is provided corresponding to one or a plurality of subpixels (see FIG. 2 to FIG. 7), and the light source elements UD are collectively controlled. When a maximum input gray scale of the plurality of subpixels exceeds a threshold gray scale (when the region is a high gray scale region), an intensity of ultraviolet light is set to a value corresponding to the maximum input gray scale, and an application voltage corresponding to the input gray scale and the intensity of the ultraviolet light is applied to the light-emitting element of each of the plurality of subpixels.

FIG. 15 is a block diagram illustrating the functions of units of the display device according to the third embodiment, FIG. 16(a) is a graph showing a gray scale-light emission luminance characteristic of a subpixel, FIG. 16(b) is a graph showing a relationship between an excessive gray scale and a PL luminance, FIG. 16(c) is a graph showing a relationship between a UV intensity and a PL luminance, FIG. 16(d) is a graph showing a relationship between a gray scale and an EL luminance, and FIG. 16(e) is an explanatory diagram showing an example of a position of a subpixel and a light emission intensity.

The control unit 11 linearly converts input image data (an input gray scale) by using a conversion table Tc, and calculates a PL luminance corresponding to an excessive gray scale based on the excessive gray scale and the PL luminance table Tp.

As shown in FIG. 16(a), the conversion table Tc is obtained by projecting a gamma curve γc (for example, gamma for HDR) onto a linear function Sk (intersecting with the gamma curve γc at minimum and maximum gray scales).

Here, in a case where the brightest gray scale in an image is determined as the maximum input gray scale, and a gray scale corresponding to an EL luminance (maximum EL luminance) when an application voltage to the light-emitting element is maximized is determined to be a threshold gray scale Th, compensation by photoluminescence is performed when the maximum input gray scale>the threshold gray scale Th is satisfied. An excessive gray scale is a difference between a linear conversion value of the maximum input gray scale and a linear conversion value of the threshold gray scale Th, and in the PL luminance table Tp, the PL luminance linearly increases according to the linear function Sk in response to a change in the excessive gray scale from 0 to the maximum excessive gray scale (indicated by an arrow).

Next, the control unit 11 calculates a UV intensity based on the calculated PL luminance and the UV intensity table Tu, calculates an EL luminance by subtracting the PL luminance from the light emission luminance for the input gray scale (when the calculation result is negative, the EL luminance is set to 0), and obtains an output gray scale based on the calculated EL luminance and the EL luminance table Te.

The control unit 11 controls the light source substrate drive circuit 13 based on the calculated UV intensity, and controls the panel drive circuit 14 based on the obtained output gray scale. The panel drive circuit 14 writes a data signal corresponding to the output gray scale to the subpixel, and an application voltage corresponding to the data signal is applied to the light-emitting element ED (between the first and second electrodes).

It is desirable to prepare a set of the conversion table Tc, the PL luminance table Tp, the UV intensity table Tu, and the EL luminance table Te for each luminescent color of a subpixel.

For example, when the maximum input gray scale is for the first subpixel SP1, the UV intensity is calculated by using the conversion table Tc, the PL luminance table Tp, and the UV intensity table Tu for red light emission. On the other hand, for the second subpixel SP2, the PL luminance is calculated based on the UV intensity and the UV intensity table Tu for green light emission, and for the third subpixel SP3, the PL luminance is calculated based on the UV intensity and the UV intensity table Tu for blue fight emission.

In the configuration using the quantum dot light-emitting layer Lw (see FIG. 6), a PL luminance in the UV intensity table Tu is a wavelength component of each color (red, green, and blue) in white light.

In addition, the UV irradiation to the light-emitting element ED may affect electroluminescence. Thus, it is desirable to create the EL luminance table Te for each level of the UV intensity and then, select the EL luminance table Te corresponding to the UV intensity (in particular, the configurations in FIG. 2 and FIG. 3).

In the third embodiment, as illustrated in FIG. 15(e), the luminance corresponding to the excessive gray scale is compensated by the photoluminescence luminance, which makes it possible to display a high-luminance image such as an HDR image without increasing the electroluminescence of the light-emitting element (without accelerating deterioration).

Fourth Embodiment

FIG. 17(a) is a block diagram illustrating the functions of units of a display device according to a fourth embodiment, and FIG. 17(b) is a schematic view illustrating an example of the display device according to the fourth embodiment. FIG. 18(a) is a graph showing a gray scale-light emission luminance characteristic of a subpixel, FIG. 18(b) is a graph showing a relationship between a minimum linear gray scale and a PL luminance, FIG. 18(c) is a graph showing a relationship between a UV intensity and a PL luminance, FIG. 18(d) is a graph showing a relationship between a gray scale and an EL luminance, and FIG. 18(e) is an explanatory diagram showing an example of a position of a subpixel and a light emission intensity.

In the fourth embodiment, a plurality of local areas each of which includes a plurality of pixels are provided in the display panel 40, and a plurality of light source elements (UDa and UDb) are provided so as to correspond to the plurality of local areas. Then, by performing individual control (local dimming) for each light source element, a minimum luminance is expressed by photoluminescence of the light-emitting element, and an insufficient luminance is expressed by electroluminescence of the light-emitting element for each local area. Note that a group including a plurality of light source elements may be provided corresponding to each local area, and individual control may be performed for each group. Examples of the configuration of the display device include the configurations illustrated in FIGS. 2(a) and (b), FIGS. 3(a) and (b), FIGS. 4(a) and (b), FIGS. 5(a) and (b), FIGS. 6(a) and (b), and FIGS. 7(a) and (b).

The control unit 11 linearly converts input image data (an input gray scale) by using a conversion table Tc (for example, converts an input gray scale Ti into a linear gray scale Tj), and calculates a PL luminance (corresponding to the minimum luminance in an image) corresponding to the minimum linear gray scale for each local area based on the linear conversion value (minimum linear gray scale) of the minimum input gray scale that is the darkest gray scale in the local area and the PL luminance table Tp.

As shown in FIG. 18(a), the conversion table Tc is obtained by projecting a gamma curve γc (gray scale-light emission luminance characteristic) onto a linear function Sk (intersecting with the gamma curve ye at minimum and maximum gray scales). The PL luminance table Tp is created such that a PL luminance linearly increases according to the linear function Sk in response to a change in the minimum linear gray scale from 0 to the maximum gray scale.

Next, the control unit 11 calculates a UV intensity for each local area based on the calculated PL luminance and the UV intensity table Tu, calculates an EL luminance by subtracting the PL luminance from a light emission luminance (for example, Lj) for a linear gray scale (when the calculation result is negative, the EL luminance is set to 0), and obtains an output gray scale based on the calculated EL luminance and the EL luminance table Te. Note that when a relationship between the UV intensity and the PL luminance becomes non-linear, a UV intensity table Tu shown in another example in FIG. 18(c) may be used.

The control unit 11 controls the light source substrate drive circuit 13 based on the UV intensity calculated for each local area (for example, a first area<a second area), and controls the panel drive circuit 14 based on the obtained output gray scale. The panel drive circuit 14 writes a data signal corresponding to the output gray scale to the subpixel, and an application voltage corresponding to the data signal is applied to the light-emitting element. ED (between the first and second electrodes). As a result, it is possible to obtain the light emission luminance corresponding to the image data as shown in FIG. 18(*e*).

Figure 18:
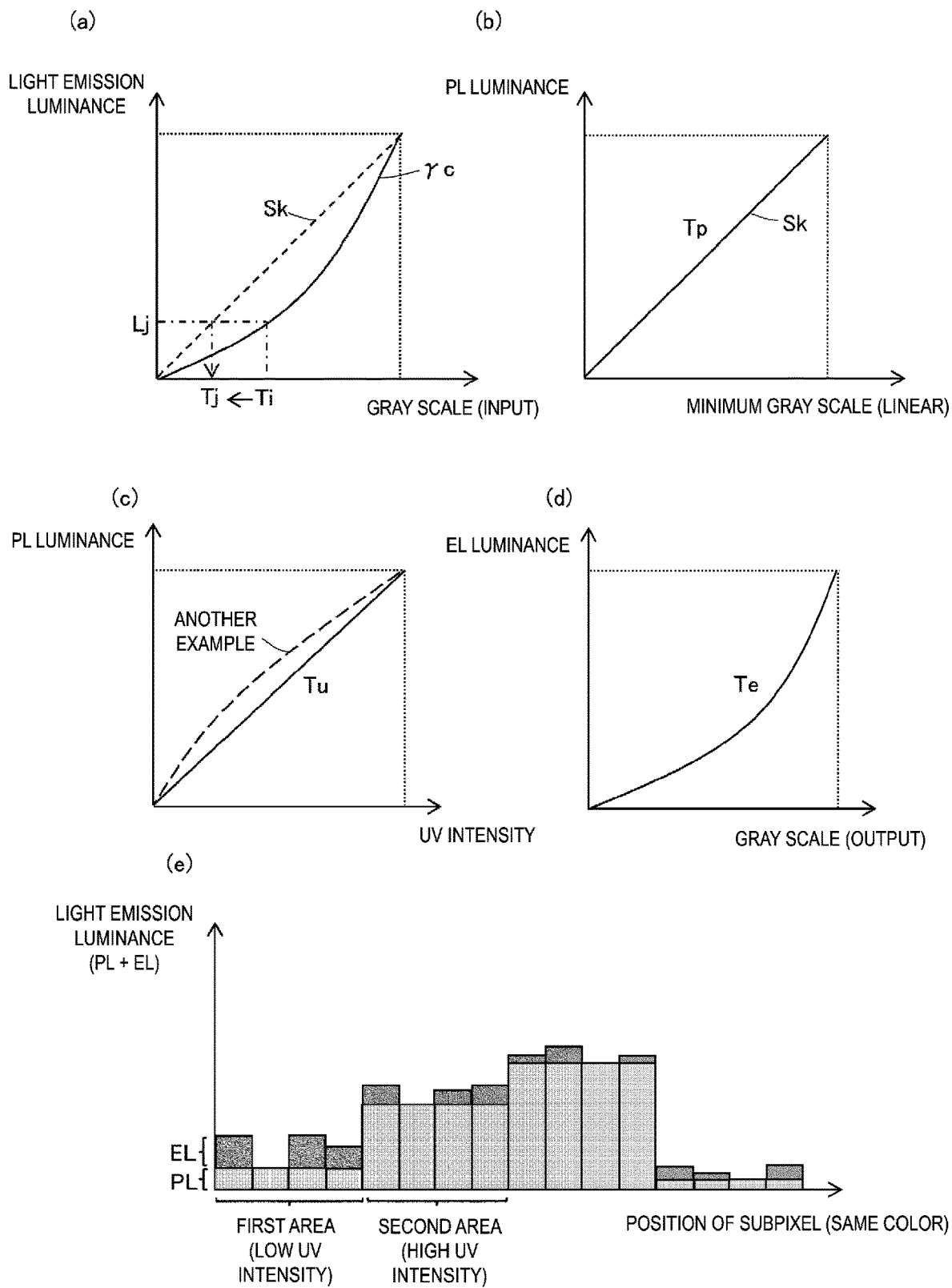

In the fourth embodiment, as shown in FIG. 18(*e*), the minimum luminance of each local area is set to a common photoluminescence luminance among the subpixels, which can reduce the electroluminescence (EL luminance) of the light-emitting element, and can extend the lifetime.

Figure 20:
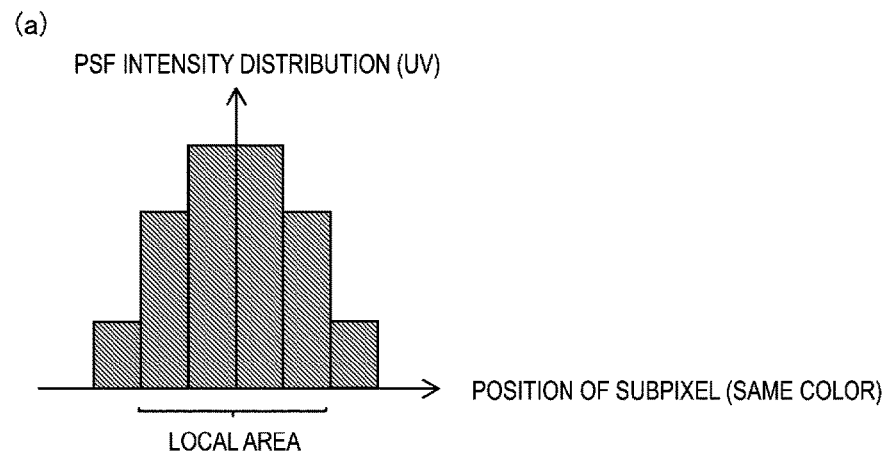
Figure 20:
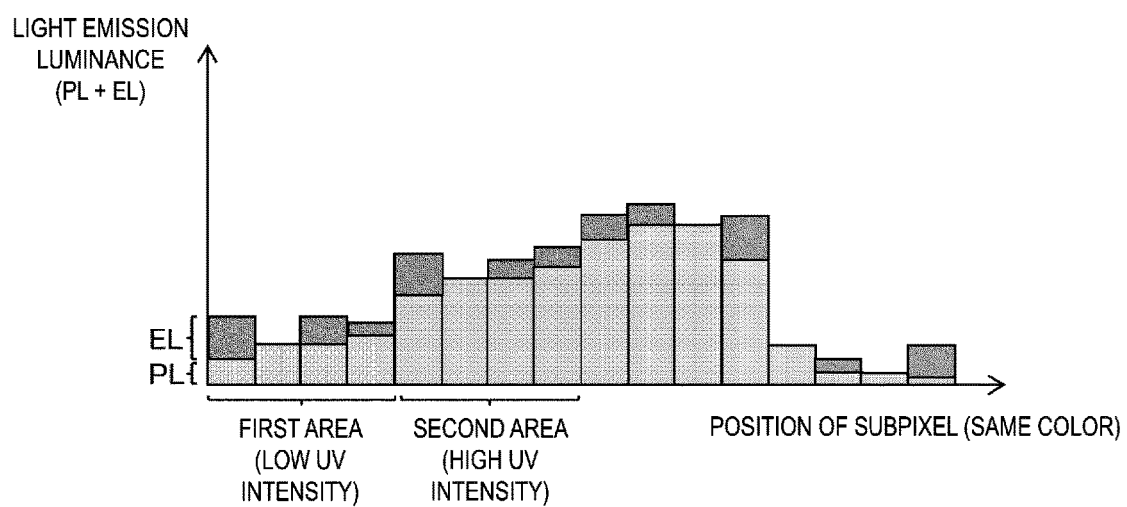

FIG. 19 is a block diagram illustrating another configuration of the display device according to the fourth embodiment. FIG. 20(*a*) is a graph showing a gray scale-light emission luminance characteristic of a subpixel, and FIG. 20(*b*) is an explanatory diagram showing an example of a position of a subpixel and a light emission intensity.

In the fourth embodiment, a UV intensity distribution in the local area and an intensity interference between the local areas may be considered. For example, when each local area has a UV intensity distribution as shown in FIG. 20(*a*), the linear gray scale after the linear conversion is multiplied by a weight coefficient based on Point Spread Function (PST) data as illustrated in FIG. 19. Then, an actual UV intensity distribution is calculated by using the UV intensity (an output value of the light source element) for each local area and the PSF data, and a PL luminance (actual luminance) for each subpixel is calculated based on the UV intensity distribution. Then, an EL luminance is calculated by subtracting the PL luminance (actual luminance) from the light emission luminance corresponding to the linear gray scale, and the output gray scale is obtained based on the calculated EL luminance and the EL luminance table Te. In this way, it is possible to obtain a light emission luminance more faithful to the image data, as shown in FIG. 20(*b*).

The embodiments described above are for the purpose of illustration and description and are not intended to be limiting. It will be apparent to those skilled in the art that many variations will be possible in accordance with these examples and descriptions.

The invention claimed is:

1. A display device comprising:
a light-emitting element including a first electrode, a second electrode, and a first quantum dot light-emitting layer disposed between the first electrode and the second electrode;
a light source element configured to irradiate the light-emitting element with ultraviolet light; and
a display panel including a plurality of subpixels,
wherein each of the plurality of subpixels includes the light-emitting element,
an intensity of the ultraviolet light is set to a value corresponding to a minimum input gray scale of the plurality of subpixels, and
an application voltage corresponding to an input gray scale and the intensity of the ultraviolet light is applied to the light-emitting element of each of the plurality of subpixels.

2. The display device according to claim 1,
wherein the light source element is provided corresponding to each of the plurality of subpixels.

3. The display device according to claim 1,
wherein the light source element is provided corresponding to the plurality of subpixels.

4. The display device according to claim 1,
wherein the first quantum dot light-emitting layer is irradiated with the ultraviolet light.

5. The display device according to claim 1,
wherein the light-emitting element further includes a second quantum dot light-emitting layer,
the second quantum dot light-emitting layer is irradiated with the ultraviolet light, and
no voltage is applied to the second quantum dot light-emitting layer.

6. The display device according to claim 5,
wherein the second quantum dot light-emitting layer is larger in thickness than the first quantum dot light-emitting layer.

7. The display device according to claim 5,
wherein the second quantum dot light-emitting layer is provided corresponding to each of the plurality of subpixels.

8. The display device according to claim 5,
wherein the second quantum dot light-emitting layer is provided in common to the plurality of subpixels.

9. The display device according to claim 5,
wherein the second quantum dot light-emitting layer is positioned closer than the first quantum dot light-emitting layer to a side of the light source element.

10. A display device comprising:
a light-emitting element including a first electrode, a second electrode, and a first quantum dot light-emitting layer disposed between the first electrode and the second electrode;
a light source element configured to irradiate the light-emitting element with ultraviolet light; and
a display panel including a plurality of subpixels,
wherein each of the plurality of subpixels includes the light-emitting element,
the light source element is provided corresponding to each of the plurality of subpixels
for each of the plurality of subpixels, in a case that an input gray scale is equal to or lower than a predetermined gray scale, an intensity of the ultraviolet light is set to a value corresponding to the input gray scale, and in a case that the input gray scale exceeds the predetermined gray scale, the intensity of the ultraviolet light is set to a maximum value, and
an application voltage corresponding to the input gray scale and the maximum value is applied to the light-emitting element.

11. A display device comprising:
a light-emitting element including a first electrode, a second electrode, and a first quantum dot light-emitting layer disposed between the first electrode and the second electrode;
a light source element configured to irradiate the light-emitting element with ultraviolet light; and
a display panel including a plurality of subpixels,
wherein each of the plurality of subpixels includes the light-emitting element,
in a case that a maximum input gray scale of the plurality of subpixels exceeds a threshold gray scale, an intensity of the ultraviolet light is set to a value corresponding to the maximum input gray scale, and
an application voltage corresponding to an input gray scale and the intensity of the ultraviolet light is applied to the light-emitting element of each of the plurality of subpixels.

12. The display device according to claim 1,
wherein the display panel further includes a plurality of local areas,
the plurality of subpixels is included in each of the plurality of local areas, and the light source element is provided corresponding to each of the plurality of local areas.

13. The display device according to claim 12, wherein the plurality of local areas includes a first area and a second area, and an intensity of the ultraviolet light of the light source element corresponding to the second area is made larger than an intensity of the ultraviolet light of the light source element corresponding to the first area.

14. The display device according to claim 13, wherein a minimum input gray scale of the plurality of subpixels included in the second area is larger than a minimum input gray scale of the plurality of subpixels included in the first area.

15. The display device according to claim 1, further comprising:

an ultraviolet cut filter at a viewing face side of the display panel.

16. The display device according to claim 1, wherein the light-emitting element further includes an electron transport layer and a hole transport layer, and the first quantum dot light-emitting layer is disposed between the electron transport layer and the hole transport layer.

17. The display device according to claim 1, wherein the light source element is provided at a back face side of the display panel.

18. The display device according to claim 3, wherein the light source element is provided at a viewing face side of the display panel.

* * * * *